US008663387B2

(12) United States Patent
Im

(10) Patent No.: US 8,663,387 B2
(45) Date of Patent: Mar. 4, 2014

(54) METHOD AND SYSTEM FOR FACILITATING BI-DIRECTIONAL GROWTH

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 107 days.

(21) Appl. No.: 11/372,161

(22) Filed: Mar. 9, 2006

(65) Prior Publication Data
US 2007/0010074 A1 Jan. 11, 2007

Related U.S. Application Data

(63) Continuation of application No. PCT/US2004/030328, filed on Sep. 16, 2004.

(60) Provisional application No. 60/503,420, filed on Sep. 16, 2003.

(51) Int. Cl.
C30B 1/06 (2006.01)

(52) U.S. Cl.
USPC ............................ 117/4; 117/5; 117/8; 117/9

(58) Field of Classification Search
USPC .................................................. 117/4, 5, 8, 9
See application file for complete search history.

(56) References Cited

U.S. PATENT DOCUMENTS

| | | | |
|---|---|---|---|
| 3,632,205 A | 1/1972 | Marcy | |
| 4,187,126 A | 2/1980 | Radd et al. | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,514,895 A | 5/1985 | Nishimura | |
| 4,639,277 A | 1/1987 | Hawkins | |
| 4,691,983 A | 9/1987 | Kobayashi et al. | |
| 4,727,047 A | 2/1988 | Bolzer et al. | |

(Continued)

FOREIGN PATENT DOCUMENTS

| | | |
|---|---|---|
| DE | 19839718 | 3/2000 |
| DE | 10103670 | 8/2002 |

(Continued)

OTHER PUBLICATIONS

U.S. Appl. No. 10/308,958, Im et al., filed Dec. 3, 2002.*

(Continued)

Primary Examiner — Bob M Kunemund
(74) Attorney, Agent, or Firm — Baker Botts LLP

(57) ABSTRACT

A method and system for processing at least one portion of a thin film sample on a substrate, with such portion of the film sample having a first boundary and a second boundary. One or more first areas of the film sample are successively irradiated by first beamlets of an irradiation beam pulse so that the first areas are melted throughout their thickness and allowed to re-solidify and crystallize thereby having grains grown therein. Thereafter, one or more second areas of the film sample are irradiated by second beamlets so that the second areas are melted throughout their thickness. At least two of the second areas partially overlap a particular area of the re-solidified and crystallized first areas such that the grains provided in the particular area grow into each of the at least two second areas upon re-solidification thereof.

14 Claims, 15 Drawing Sheets

(56) References Cited

U.S. PATENT DOCUMENTS

| | | |
|---|---|---|
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Suguhara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,432,122 A | 7/1995 | Chae |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,534,716 A | 7/1996 | Takemura |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,643,801 A | 7/1997 | Ishihara et al. |
| 5,663,579 A | 9/1997 | Noguchi |
| 5,683,935 A | 11/1997 | Miyamoto et al. |
| 5,696,388 A | 12/1997 | Funada et al. |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita |
| 5,981,974 A | 11/1999 | Makita |
| 5,986,807 A | 11/1999 | Fork |
| 6,002,523 A | 12/1999 | Tanaka |
| 6,014,944 A | 1/2000 | Russell et al. |
| 6,020,224 A | 2/2000 | Shimogaichi et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Farmiga et al. |
| 6,582,827 B1 | 6/2003 | Im |
| 6,590,228 B2 | 7/2003 | Voutsas et al. |
| 6,599,790 B1 | 7/2003 | Yamazaki et al. |
| 6,608,326 B1 | 8/2003 | Shinagawa et al. |
| 6,621,044 B2 | 9/2003 | Jain et al. |

(56) References Cited

U.S. PATENT DOCUMENTS

| | | |
|---|---|---|
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,744,069 B1 | 6/2004 | Yamazaki et al. |
| 6,746,942 B2 | 6/2004 | Sakamoto et al. |
| 6,750,424 B2 | 6/2004 | Tanaka |
| 6,755,909 B2 | 6/2004 | Jung |
| 6,767,804 B2 | 7/2004 | Crowder |
| 6,770,545 B2 | 8/2004 | Yang |
| 6,777,276 B2 | 8/2004 | Crowder et al. |
| 6,784,455 B2 | 8/2004 | Maekawa et al. |
| 6,830,993 B1 | 12/2004 | Im et al. |
| 6,858,477 B2 | 2/2005 | Deane et al. |
| 6,861,328 B2 | 3/2005 | Hara et al. |
| 6,908,835 B2 * | 6/2005 | Sposili et al. ............... 438/487 |
| 6,916,690 B2 | 7/2005 | Chang |
| 6,961,117 B2 * | 11/2005 | Im ............................ 355/67 |
| 6,962,860 B2 | 11/2005 | Yamazaki et al. |
| 7,049,184 B2 | 5/2006 | Tanabe |
| 7,078,281 B2 | 7/2006 | Tanaka et al. |
| 7,091,411 B2 | 8/2006 | Falk et al. |
| 7,119,365 B2 | 10/2006 | Takafuji et al. |
| 7,144,793 B2 | 12/2006 | Gosain et al. |
| 7,164,152 B2 | 1/2007 | Im |
| 7,172,952 B2 | 2/2007 | Chung |
| 7,183,229 B2 | 2/2007 | Yamanaka |
| 7,187,016 B2 | 3/2007 | Arima |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,303,980 B2 | 12/2007 | Yamazaki et al. |
| 7,311,778 B2 | 12/2007 | Im et al. |
| 7,318,866 B2 | 1/2008 | Im |
| 7,319,056 B2 | 1/2008 | Im et al. |
| 7,326,876 B2 | 2/2008 | Jung |
| 7,341,928 B2 | 3/2008 | Im |
| 7,384,476 B2 | 6/2008 | You |
| 7,507,645 B2 | 3/2009 | You |
| 7,560,321 B2 | 7/2009 | Kato et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0030292 A1 | 10/2001 | Brotherton |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0022417 A1 | 1/2003 | Steele et al. |
| 2003/0029212 A1 | 2/2003 | Im |
| 2003/0057418 A1 | 3/2003 | Asano |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0194613 A1 | 10/2003 | Voutsas et al. |
| 2003/0196589 A1 | 10/2003 | Mitani et al. |
| 2004/0040938 A1 | 3/2004 | Yamazaki et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im |
| 2005/0236908 A1 | 10/2005 | Rivin |
| 2006/0030164 A1 | 2/2006 | Im |
| 2006/0035478 A1 | 2/2006 | You |
| 2006/0040512 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0020942 A1 | 1/2007 | Im |
| 2007/0032096 A1 | 2/2007 | Im |
| 2007/0051302 A1 | 3/2007 | Gosian et al. |
| 2007/0108472 A1 | 5/2007 | Jeong et al. |
| 2007/0111349 A1 | 5/2007 | Im |
| 2007/0184638 A1 | 8/2007 | Kang et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0045181 A1 | 2/2009 | Im |
| 2009/0137105 A1 | 5/2009 | Im |
| 2009/0173948 A1 | 7/2009 | Im et al. |
| 2009/0189164 A1 | 7/2009 | Im et al. |
| 2009/0218577 A1 | 9/2009 | Im |
| 2009/0242805 A1 | 10/2009 | Im |
| 2009/0309104 A1 | 12/2009 | Im |
| 2010/0024865 A1 | 2/2010 | Shah et al. |
| 2010/0032586 A1 | 2/2010 | Im et al. |
| 2010/0065853 A1 | 3/2010 | Im |
| 2010/0099273 A1 | 4/2010 | Im |
| 2010/0197147 A1 | 8/2010 | Im |
| 2010/0233888 A1 | 9/2010 | Im |

FOREIGN PATENT DOCUMENTS

| | | |
|---|---|---|
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | S57-027035 | 2/1982 |
| JP | 62160781 | 7/1987 |
| JP | 62181419 | 8/1987 |
| JP | 62216320 | 9/1987 |
| JP | H01-256114 | 10/1989 |
| JP | 02081422 | 3/1990 |
| JP | 2283036 | 11/1990 |
| JP | 04033327 | 2/1992 |
| JP | H04-167419 | 6/1992 |
| JP | 4279064 | 10/1992 |
| JP | 04282869 | 10/1992 |
| JP | 5 041519 | 2/1993 |
| JP | 05048190 | 2/1993 |

(56) References Cited

FOREIGN PATENT DOCUMENTS

| | | |
|---|---|---|
| JP | 06-011729 | 1/1994 |
| JP | 6252048 | 9/1994 |
| JP | H06-260502 | 9/1994 |
| JP | 6283422 | 10/1994 |
| JP | 7176757 | 7/1995 |
| JP | H08-078330 | 3/1996 |
| JP | 09007968 | 1/1997 |
| JP | 1997-171971 | 6/1997 |
| JP | H09-270393 | 9/1997 |
| JP | 9260681 A | 10/1997 |
| JP | 9321310 A | 12/1997 |
| JP | 10 189998 | 7/1998 |
| JP | 10244390 | 9/1998 |
| JP | 11064883 | 3/1999 |
| JP | 11281997 | 10/1999 |
| JP | H11-297852 | 10/1999 |
| JP | 11330000 A | 11/1999 |
| JP | 2000-223425 | 8/2000 |
| JP | 2000-315652 | 11/2000 |
| JP | 2000-346618 | 12/2000 |
| JP | 2001023920 | 1/2001 |
| JP | 2002-203809 | 7/2002 |
| JP | 2002-353142 | 12/2002 |
| JP | 2002-353159 | 12/2002 |
| JP | 2003-031496 | 1/2003 |
| JP | 2003100653 | 4/2003 |
| JP | 2003-523723 | 8/2003 |
| JP | 2004-031809 | 1/2004 |
| KR | 2000-0053428 | 8/2000 |
| TW | 464960 | 11/2001 |
| TW | 564465 | 12/2003 |
| TW | 569350 | 1/2004 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | WO01071791 | 9/2001 |
| WO | WO 0173769 | 10/2001 |
| WO | WO 0197266 | 12/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 03046965 | 6/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |
| WO | WO 2004030328 | 9/2004 |
| WO | WO2005029546 | 3/2005 |
| WO | WO2005029548 | 3/2005 |
| WO | WO 2005029549 | 3/2005 |
| WO | WO2005029550 | 3/2005 |
| WO | WO2005029551 | 3/2005 |
| WO | WO 2006/055003 | 5/2006 |

OTHER PUBLICATIONS

U.S. Appl. No. 10/525,283, Im, filed Feb. 16, 2005.*
U.S. Appl. No. 10/525,288, Im, filed Feb. 16, 2005.*
U.S. Appl. No. 10/525,297, Im, filed Feb. 15, 2005.*
U.S. Appl. No. 10/544,498, Im, filed Aug. 3, 2005.*
U.S. Appl. No. 11/370,000, Im, filed Mar. 7, 2006.*
U.S. Appl. No. 11/372,148, Im, filed Mar. 9, 2006.*
U.S. Appl. No. 11/651,305, Im, filed Jan. 9, 2007.*
U.S. Appl. No. 60/253,256, filed Aug. 31,2003, Im.
Im et al., "Controlled Super-Lateral Growth of Si Films for Microstructural Manipulation and Optimization", Phys. Stat. Sol. (a), vol. 166, p. 603 (1998).
S.D. Brotherton et al., "Influence of Melt Depth in Laser Crystallized Poly-Si Thin Film Transistors," 82 J. Appl. Phys. 4086 (1997).
J.S. Im et al., "Crystalline Si Films for Integrated Active-Matrix Liquid-Crystals Displays," 21 MRS Bulletin 39 (1996).
Im et al., "Single-Crystal Si Films for Thin-Film Transistor Devices," Appl. Phys. Lett., vol. 70 (25), p. 3434 (1997).
Sposili et al., "Sequential Lateral Solidification of Thin Silicon Films on SiO2", Appl, Phys. Lett., vol. 69 (19), p. 2864 (1996).
Crowder et al., "Low-Temperature Single-Crystal Si TFT's Fabricated on Si Films processed via Sequential Lateral Solidification", IEEE Electron Device Letter, vol. 19 (8), p. 306 (1998).
Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.
C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.
J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.
H. Endert et al., "Excimer Laser: A New Tool for Precision Micromaching," 27 Optical and Quantum Electronics, 1319 (1995).
"Overview of Beam Delivery Systems for Excimer Lasers," Micro/Las Lasersystem GMBH. 1999.
K.H. Weiner et al., "Ultrashallow Junction Formation Using Projection Gas Immersion Laser Doping (PGILD)," A Verdant Technologies Technical Brief, Aug. 20, 1997.
Hau-Riege C.S. et al., "The Effects Microstructural Transitions at Width Transitions on interconnect reliability," Journal of Applied Physics, Jun. 15, 2000, vol. 87, No. 12, pp. 8467-8472.
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.
Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.
Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.
H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.
S.D. Brotherton, "Polycrystalline Silicon Thin Film Transistors," 10 Semicond. Sci. Tech., pp. 721-738 (1995).
H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).
E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).
Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).
Im et al., "Phase Transformation Mechanisms Involved in Excimer Laser Crystallization of Amorphous Silicon Films," Appl. Phys. Lett., vol. 63 (14), p. 1969 (1993).
Im et al., "On the Super Lateral Growth Phenomenon Observed in Excimer Laser-Induced Crystallization of Thin Si Films," Appl. Phys. Lett., vol. 64 (17), p. 2303 (1994).
Brochure from MicroLas Lasersystem, GmbH, "UV Optics Systems for Excimer Laser Based Micromaching and Marking". 1999.

(56) References Cited

OTHER PUBLICATIONS

Ishida et al., "Ultra-shallow boxlike profiles fabricated by pulsed ultraviolet-laser doping process", J. Vac. Sci. Technol. B 12(1), p. 399-403, 1994. (No month).
Yoshimoto, et al., "Excimer-Laser-Produced and Two-Dimensionally Position-Controlled Giant Si Grains on Organic SOG Underlayer", p. 285-286, AM-LCD 2000. No month.
Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.
I.W. Boyd, Laser Processing of Thin Films and Microstructures, Oxidation, Deposition, and Etching of Insulators (Springer—Verlag Berlin Heidelber 1987).
N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.
T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.
Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.
Kim, H. J., "Excimer-Laser-Induced Crystallization of Amorophus Silicon Thin Films", Ph. D. Dissertation Abstract, Columbia University, 1996.
Brotherton, S.D., et al., Characterisation of poly-Si TFTs in Directionally Solidified SLS Si, Asia Display/IDS'01, p. 387-390.
Dassow, R. et al. Laser-Crystallized Polycrystalline Silicon on Glass for Photovoltaic Applications, Solid State Phenomena, pp. 193-198, vols. 67-68, Scitec Publications, Switzerland.
Im, J.S., Method and system for producing crystalline thin films with a uniform crystalline orientation, U.S. Appl. No. 60/503,419; ref. file # 36013(BB); Columbia ref. M02-063.
Kim, H.J. et al., "New Excimer-laser-crystallization method for producing large-grained and grain boundary-location-controlled Si Films for Thin Film Transistors", Applied Phys. Lett., 68: 1513.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.
Gosain et al., Formation of (100)-Textured Si Film Using an Excimer Laser on a GlassSubstrate, Jpn. J. Appl. Phys., vol. 42 (2003) pp. L135-L137, 2003.
Jeon et al., "New Excimer Laser Recrystallization of Poly-Si for Effective Grain Growth and Grain Boundary Arrangement," Jpn. J. Appl. Phys. vol. 39 (Apr. 2000) pp. 2010-2014.
Bergmann et al., "The future of crystalline silicon films on foreign substrates," Thin Solid Films 403-404 (2002) 162-169.
Andra et al., "Multicrystalline LLC-SI Thin Film Solar Cells on Low Temperature Glass", *3rd World Conference on Photovoltaic Energy Conversion* May 11-18, 2003, Osaka, Japan, Poster, pp. 1174-1177 (2003).
Andra et al., "A new technology for crystalline silicon thin film solar cells on glass based on laser crystallization", *Photovoltiac Specialists Conference. Conference Record of the Twenty-Eight IEEE*, pp. 217-220 (2000).
Sinke et al., "Explosive crystallization of amorphous silicon: Triggering and propagation", *Applied Surface Science*, 43:128-135 (1989).
van der Wilt et al., "A hybrid approach for obtaining orientation-controlled single-crystal Si regions on glass substrates", Proc. of SPIE vol. 6106, 61060B-1-B-15, (2006) XP009151485.
Bergmann, R. et al., Nucleation and Growth of Crystalline Silicon Films on Glass for Solar Cells, Phys. Stat. Sol., 1998, pp. 587-602, vol. 166, Germany.
Biegelsen, D.K., L.E. Fennell and J.C. Zesch, Origin of oriented crystal growth of radiantly melted silicon on SiO/sub 2, Appl. Phys. Lett. 45, 546 (1984).
Boyd, Laser Processing of Thin Films and Microstructures, Oxidation, Deposition, and Etching of Insulators (Springer—Verlag Berlin Heidelber 1987).
Brotherton, S.D., et al., Characterisation of poly-Si TFTs in Directionally Solidified SLS Si, Asia Display/IDS'01, p. 387-390, 2001.
Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland, 1999.
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of SI Films with a moveable-strip heater oven" J. Electro-Chem. Soc., 129: 2812 (1982).
Gupta et al., "Numerical Analysis of Excimer-laser induced melting and solidification of Si Thin Films", Applied Phys. Lett., 71:99, 1997.
Hau-Reige et al., "Microstructural Evolution Induced by Scanned Laser Annealing in Al Interconnects," Appl. Phys. Lett., vol. 75, No. 10, p. 1464-1466, 1999.
Hawkins, W.G. et al., "Origin of lamellae in radiatively melted silicon films," appl. Phys. Lett. 42(4), Feb. 15, 1983.
Hayzelden, C. and J.L. Batstone, Silicide formation and silicide-mediated crystallization of nickel-implanted amorphous silicon thin films, J. Appl. Phys. 73, 8279 (1993).
Im, J.S., Method and system for producing crystalline thin films with a uniform crystalline orientation, U.S. Appl. No. 60/503,419; ref. file # 36013(BB); Columbia ref. M02-063, Sep. 2003.
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals", OE Magazine, Nov. 2001, 33-35.
Kim, C. et al., Development of SLS-Based SOG Display, IDMC 2005, Thu-15-02, 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.J. et al., "New Excimer-laser-crystallization method for producing large-grained and grain boundary-location-controlled Si Films for Thin Film Transistors", Applied Phys. Lett., 68: 1513, Mar. 1996.
Kim, H.J. et al., "Multiple Pulse Irradiation Effects in Excimer Laser-Induced Crystallization of Amorphous Si Films," Mat. Res. Soc. Sym. Proc., 321:665-670 (1994).

(56) References Cited

OTHER PUBLICATIONS

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3 , 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. And S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on, 2000 pp. 55-61.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

Van Der Wilt, P.C., "State-of-the-Art Laser Crystallization of Si for Flat Panel Displays," PhAST, May 18, 2004, pp. 1-34.

Van Der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

* cited by examiner

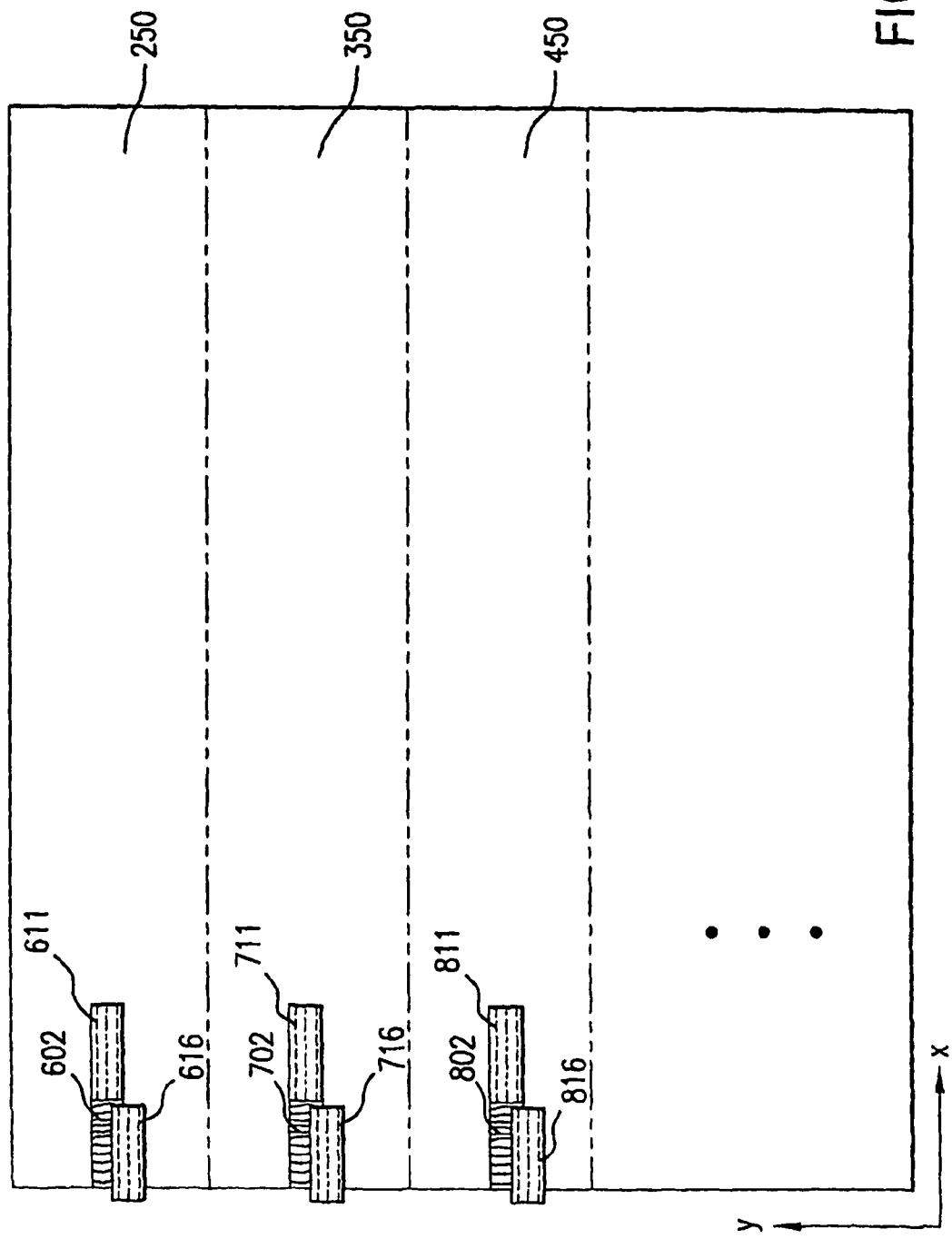

METHOD AND SYSTEM FOR FACILITATING BI-DIRECTIONAL GROWTH

CROSS-REFERENCE TO RELATED APPLICATIONS

This application is a continuation of International Application Serial No. PCT/US04/030328, filed Sep. 16, 2004, published Mar. 31, 2005, which claims priority from U.S. Provisional Application Serial No. 60/503,420, filed Sep. 16, 2003, each of which are incorporated by reference in their entireties herein, and from which priority is claimed.

FIELD OF THE INVENTION

The present invention relates to a method, system and mask for processing a thin-film semiconductor material, and more particularly to forming large-grained, grain-shaped and grain-boundary-location controlled semiconductor thin films from amorphous or polycrystalline thin films on a substrate by single-scanning the entire sample or at least one portion thereof using a sequential lateral solidification technique so as to promote a bi-directional growth of the grains in the resolidifying melted sample or in the portion(s) thereof.

BACKGROUND INFORMATION

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bulletin 39 (1996) an overview of conventional excimer laser annealing technology is described. In such conventional system, an excimer laser beam is shaped into a beam having an elongated cross-section which is typically up to 30 cm long and 500 micrometers or greater in width. The shaped beam is stepped over a sample of amorphous silicon (i.e., by translating the sample) to facilitate melting thereof and to effectuate the formation of grain-shape and grain boundary-controlled polycrystalline silicon upon the re-solidification of the sample. Such techniques has been referred to a sequential lateral solidification ("SLS") of the melted portions of the sample to effectuate the growth of longer grain boundaries therein so as to achieve, e.g., uniformity among other thing.

Various techniques processes, masks and samples have been previously described which utilize various SLS techniques, to effectively process the sample. For example, International Publication No. 02/086954 describes a method and system for providing a single-scan, continuous motion sequential lateral solidification of melted sections of the sample being irradiated by beam pulses. In this publication, an accelerated sequential lateral solidification of the polycrystalline thin film semiconductors provided on a simple and continuous motion translation of the semiconductor film are achieved, without the necessity of "microtranslating" the thin film, and re-irradiating the previously irradiated region in the direction which is the same as the direction of the initial irradiation of the thin film while the sample is being continuously translated.

One of the objects of the present invention is to increase the grain size of the melted and re-solidified SLS processed samples and/or portions thereof via limited irradiation of such portions and/or sample for obtaining a desired grain length.

SUMMARY OF THE INVENTION

An object of the present invention is to provide techniques for producing large-grained and grain-shape and grain-boundary, location controlled polycrystalline thin film semiconductors using a sequential lateral solidification ("SLS") process, and to generate such silicon thin films in an accelerated manner by growing the grains bi-directionally within the re-solidifying areas.

This and other objects can be achieved with an exemplary embodiment of a method and system for processing at least one portion of a thin film sample on a substrate, with such portion of the film sample having a first boundary and a second boundary. In particular, an irradiation beam generator emits successive irradiation beam pulses at a predetermined repetition rate. Each of the irradiation beam pulses is masked to define one or more first beamlets and one or more second beamlets. The film sample is continuously scanned at a constant predetermined speed. In addition, one or more first areas of the film sample are successively irradiated by the first beamlets so that the first areas are melted throughout their thickness, wherein each one of the first areas irradiated by the first beamlets of each of the irradiation beam pulses is allowed to re-solidify and crystallize thereby having grains grown therein. Thereafter, one or more second areas of the film sample are successively irradiated by the second beamlets of the irradiation beam pulses so that the second areas are melted throughout their thickness. At least two of the second areas partially overlap a particular area of the re-solidified and crystallized first areas such that the grains provided in the particular area grow into each of the two of the second areas upon a re-solidification thereof. Further at least one of the two of the second areas overlaps a grain boundary provided within the particular area.

BRIEF DESCRIPTION OF THE DRAWINGS

Exemplary embodiments of the present invention will now be described in further detail with reference to the accompanying drawings in which:

FIG. 4 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention;

DETAILED DESCRIPTION

Figure 1:
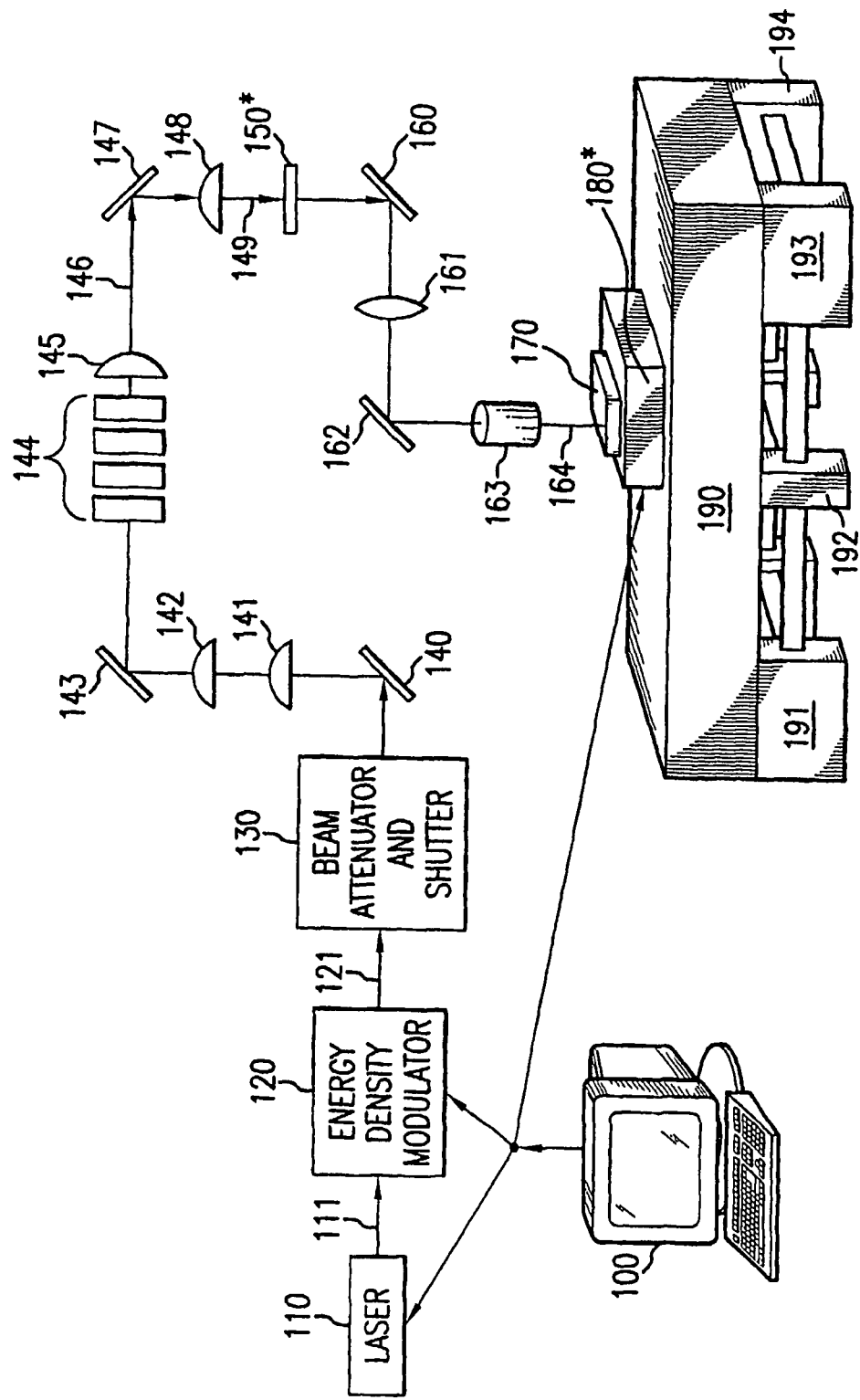
FIG. 1 shows a diagram of an exemplary embodiment of a system for performing a single-scan, continuous motion sequential lateral solidification ("SLS") according to the present invention which does not require a microtranslation of a sample for an effective large grain growth in a thin film, and effectuates a bi-directional grain growth within the irradiated and re-solidified area of the sample.

Certain systems and methods for providing a single scan, continuous motion SLS are described in International Publication No. 02/086954 (the "'954 Publication"), the entire disclosure of which is incorporated herein by reference. The '954 Publication explicitly describes and illustrates the details of these systems and methods, and their utilization of microtranslations of a sample, which may have an amorphous silicon thin film provided thereon that can be irradiated by irradiation beam pulses so as to promote the sequential lateral solidification on the thin film, without the need to microtranslate the sample and/or the beam relative to one another to obtain a desired length of the grains contained in the irradiated and re-solidified areas of the sample. Similar to the system described in the '954 Publication, an exemplary embodiment of a system for carrying out the continuous motion SLS processing of amorphous silicon thin films according to the present invention is illustrated in FIG. 1. The exemplary system includes a Lambda Physik model LPX-315I XeCl pulsed excimer laser 110 emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4x-6x eye piece 161, a controllable shutter 152, a multi-element objective lens 163 for focusing an incident radiation beam pulse 164 onto a sample 170 having a silicon thin film 52 to be SLS processed mounted on a sample translation stage 180, a granite block optical bench 190 supported on a vibration isolation and self-leveling system 191, 192, 193 and 194, and a computer 106 (e.g., a general purpose computer executing a program or a special-purpose computer) coupled to control the pulsed excimer laser 110, the beam energy density modulator 120, the variable attenuator 130, the shutter 152 and the sample translation stage 180.

The sample translation stage 180 may be controlled by the computer 106 to effectuate translations of the sample 40 in the planar X-Y directions and the Z direction. In this manner, the computer 106 controls the relative position of the sample 40 with respect to the irradiation beam pulse 164. The repetition and the energy density of the irradiation beam pulse 164 may also be controlled by the computer 106. It should be understood by those skilled in the art that instead of the pulsed excimer laser 110, the irradiation beam pulse can be generated by another known source of short energy pulses suitable for melting a semiconductor (or silicon) thin film. Such known source can be a pulsed solid state laser, a chopped continuous wave laser, a pulsed electron beam and a pulsed ion beam, etc. with appropriate modifications to the radiation beam path from the source 110 to the sample 170. In the exemplary embodiment of the system shown in FIG. 1, while the computer 106 controls translations of the sample 170 for carrying out the single-scan, continuous motion SLS processing of the thin film according to the present invention, the computer 100 may also be adapted to control the translations of the mask 150 and/or the excimer laser 110 mounted in an appropriate mask/laser beam translation stage (not shown for the simplicity of the depiction) to shift the intensity pattern of the irradiation beam pulses 164, with respect to the silicon thin film, along a controlled beam path. Another possible way to shift the intensity pattern of the irradiation beam pulse is to have the computer 100 control a beam steering mirror. The exemplary system of FIG. 1 may be used to carry out the single-scan, continuous motion SLS processing of the silicon thin film on the sample 170 in the manner described below in further detail.

An amorphous silicon thin film sample may be processed into a single or polycrystalline silicon thin film by generating a plurality of excimer laser pulses of a predetermined fluence, controllably modulating the fluence of the excimer laser pulses, homogenizing the intensity profile of the laser pulse plane, masking each homogenized laser pulses to define beamlets, irradiating the amorphous silicon thin film sample with the beamlets to effect melting of portions thereof that were irradiated by the beamlets, and controllably and continuously translating the sample 170 with respect to the patterned beamlets. The output of the beamlets is controllably modulated to thereby process the amorphous silicon thin film provided on the sample 170 into a single or grain-shape, grain-boundary-location controlled polycrystalline silicon thin film by the continuous motion sequential translation of the sample relative to the beamlets, and the irradiation of the sample by the beamlets of masked irradiation pulses of varying fluence at corresponding sequential locations thereon. One of the advantages of the system, method and mask according to the present invention is that there is a significant saving of processing time to irradiate and promote the SLS on the silicon thin film of the sample by completing the irradiation of a section of the sample 170 without requiring microtranslation of the sample (i.e., the microtranslations as described in the '954 Publication), as well as simultaneously allowing the grain growth to be effectuated in two directions, e.g., two opposite directions.

Figure 2:
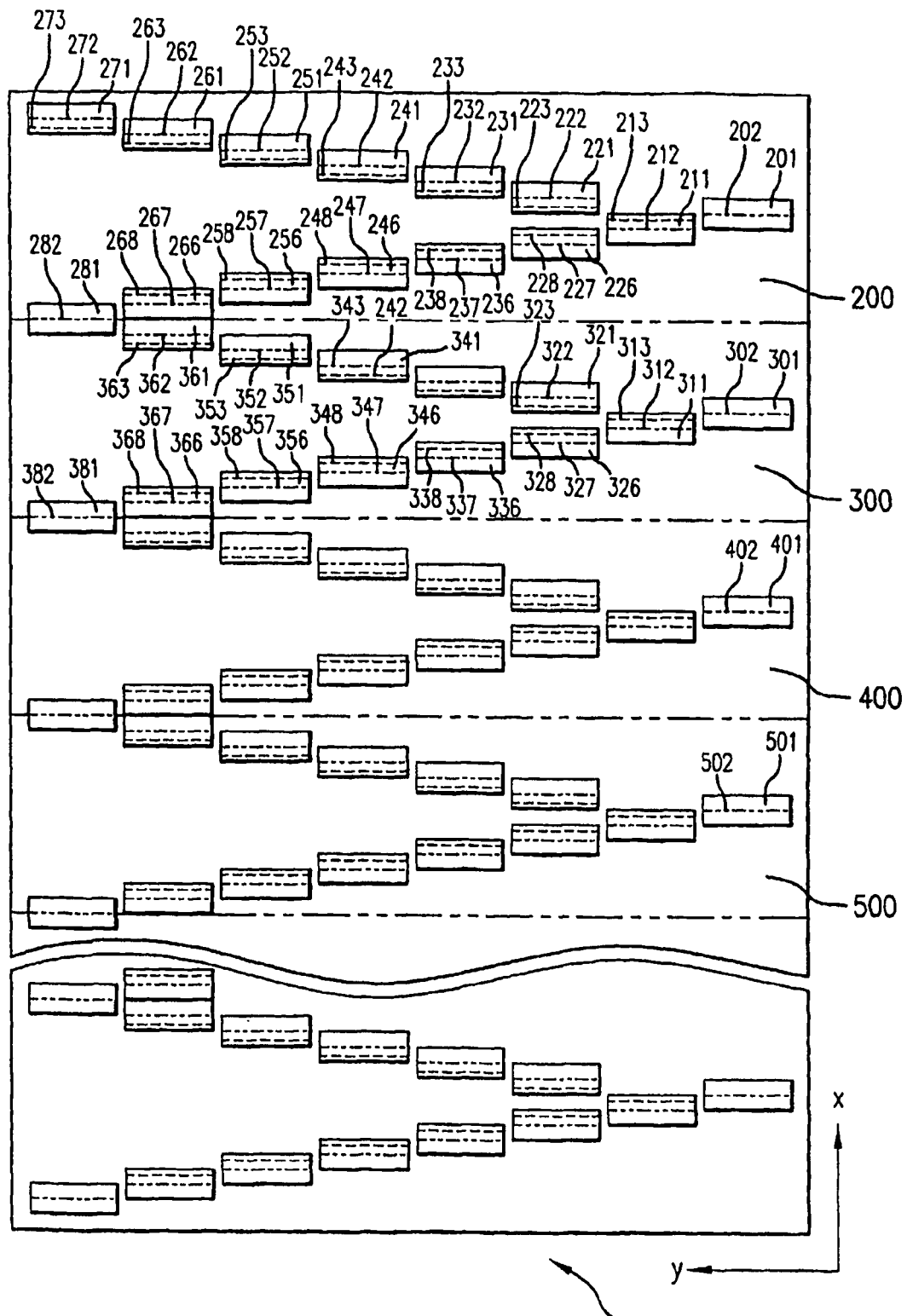
FIG. 2 shows an enlarged illustration of a first exemplary embodiment of a mask utilized by the system and method of the present invention which facilitates the single-scan, continuous motion SLS as an intensity pattern generated thereby impinges the thin film on a substrate of the sample, and facilitates a bi-directional grain growth of the irradiated, melted and resolidifying sections of the thin film.

FIG. 2 shows an enlarged illustration of a first exemplary embodiment of the mask 150 that shapes the beam being passed therethrough to produce an intensity pattern that impinges the thin film provided on the sample 170. In particular, the slits of the mask 150 allow the respective portions of the beam 149 to irradiate therethrough, while other sections of the mask 150 are opaque, and do not allow the portions of the beam 149 to be transmitted through these opaque sections. This mask 150 includes a first set of slits 201, 211, 221, 226, 231, 236, 241, 246, 251, 256, 261, 266, 271 and 281 provided in a first conceptual row 200 of the mask 150, a second set of slits 301, 311, 321, 326, 331, 336, 341, 346, 351, 356, 361, 366 and 381 in a second conceptual row 300 of the mask 150, a third set of slits 401, etc. in a fourth conceptual row 400 of the mask 150, and so on. The length of each of the slits along the positive X-direction can be 315 μm, and the width thereof can be, e.g., 5.5 μm. The dimensions of the slits may be the same as or proportional to the slit-shaped beamlets of the intensity pattern produced by passing the beam pulses through the mask 170. Other sizes and shapes of the slits, and thus of the slit-shaped beamlets are conceivable (e.g., dot-shaped slits, chevron-shaped slits, etc.) and are within the scope of the present invention.

In this exemplary embodiment, the second slit 211 of the first set of slits is provided adjacent to the first slit 201 at an offset thereof (along the positive X-direction). A middle longitudinal extension 202 of the first slit 201 is provided on a longitudinal level 213 of the second slit 211 that is slightly below a top edge of this slit 211.

The third slit 221 and the fourth slit 226 are arranged longitudinally parallel to one another, at an exemplary offset of 1.25 μm from each other. These third and fourth slits 221, 226 are provided at a horizontal offset from the second slit 211, in the positive X-direction. A longitudinal extension 228 of the fourth slit 226 is provided on a middle longitudinal level 212 of the second slit 211, which is slightly below a top edge of the fourth slit 226. A middle longitudinal extension 222 of the third slit 221 is provided approximately 4.0 μm from the top edge of the fourth slit 226.

The fifth and sixth slits 231, 236 are arranged longitudinally parallel to one another, but at a distance that is greater than the distance between the third and fourth slits 221, 226. In particular, a longitudinal extension 233 of the fifth slit 231 is provided along the extension of the bottom edge of the third slit 221, and a longitudinal extension 238 of the sixth slit 236 is provided along the extension of the top edge of the fourth slit 226. In this manner, the bottom edge of the fifth slit 231 longitudinally extends (along the Y-direction) between the longitudinal extension 223 and the middle extension 222 of the third slit 221. Also, the top edge of the sixth slit 236 longitudinally extends (again along the Y-direction) between the longitudinal extension 228 and the middle extension 227 of the fourth slit 226.

The seventh and eighth slits 241, 246 are arranged even further from one another than the relative positioning of the fifth and sixth slits 231, 236, but in a similar manner with respect to these fifth and sixth slits 231, 236 (as they are associated with the third and fourth slits 221, 226. The similar positioning description applies to the ninth and tenth slits 251, 256, then to eleventh and twelfth slits 261, 266, and finally to thirteenth and fourteenth slits 271, 281 of the first set of slits provided in the first conceptual row 200 of the mask 170.

The second set of slits provided in the second conceptual row 300 of the mask 150, as well as the slits provided in the third and fourth conceptual rows 400, 500 are arranged in a substantially similar manner, with respect to one another, as described above for the slits provided in the first conceptual row 200. Thus, using the exemplary embodiment of the method shown in FIGS. 3-11, longer grains can be grown on the thin film 52 in two opposite directions by utilizing a smaller number of shots than previously described.

Figure 3:
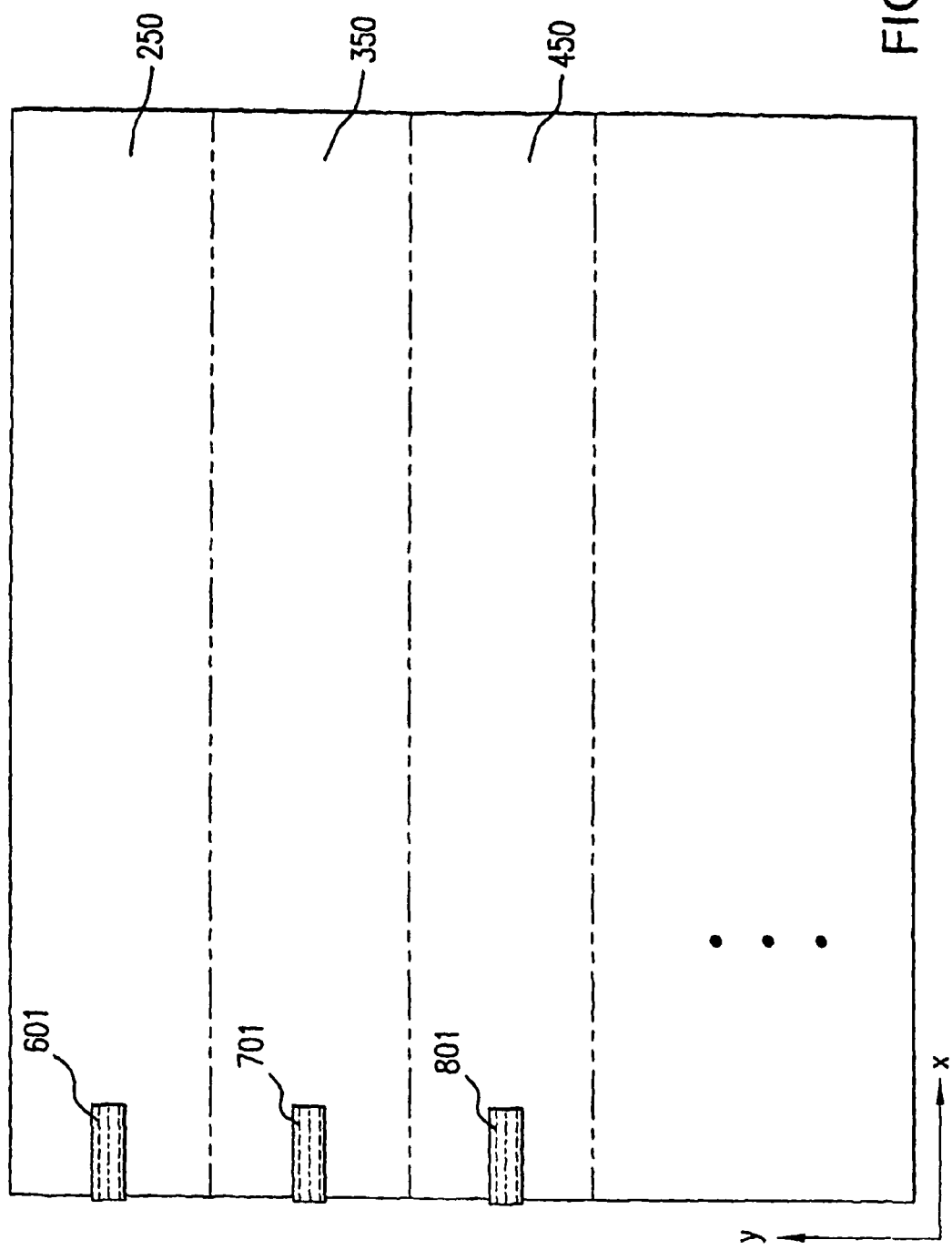
FIG. 3 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.

Turning first to FIG. 3, the sample 170 is placed on the sample translation stage 180, which is controlled by the computer 100. The sample 170 is placed such that the fixed position masked irradiation beam pulse 164 (having the intensity pattern defined by the slits of the mask 150) impinges on a location away from the sample 170. Thereafter, the sample 170 is translated in the negative Y-direction, and gains momentum to reach a predetermined velocity before the masked irradiation beam pulse 164 reaches and impinges a left edge of the sample 170. By controlling the motion of the sample 40 in the X and Y directions, the computer 100 controls the relative position of the sample 170 with respect to the masked irradiation beam pulse 164 which irradiates the thin film provided on the sample 170. The pulse duration, the pulse repetition rate and the energy of each pulse of the masked irradiation beam pulse 164 are also controlled by the computer 100.

FIG. 3 shows the initial impingement and irradiation of the sample 170 by the first set of intensity patterns produced by passing the beam pulses through the slits of the mask 150 when the translation stage 180 positions the sample 170 to be impinged and irradiated by a portion of the intensity pattern produced using the mask 150. In particular, using such translation and irradiation, only the intensity pattern that are defined as beamlets and shaped by the first slits 201, 301, 401, etc. of the respective first, second and third conceptual rows of the mask 150 impinge, irradiate, and fully melt throughout the entire thickness the corresponding portions 601, 701, 801, etc. of the respective first, second and third conceptual rows 250, 350, 450 of the sample 170. These portions 601, 701, 801 are situated at one edge of the sample 170, and their positioning with respect to one another is either substantially similar or proportional to the positioning of the first slits 201, 301, 401, and to the shape thereof. Then, the portions 601, 701 801 begin to resolidify, and the grains provided at the edges of these portions seed the melted and resolidifying portions 601, 701, 801 and grow toward the center of each of the respective portions 601, 701, 801. Details of the grain growth in each melted portion of the sample 170 are clearly understood by those having ordinary skill in the art, and described in great detail in the '954 Publication.

As shown in FIG. 4, the previously-irradiated portions 601, 701, 801 are re-solidified and crystallized into corresponding processed polycrystalline regions 602, 702, 802. Thereafter, the sample 170 is continuously translated in the negative Y-direction by the computer 100 using the sample translation stage 180. When the sample 170 reaches the next sequential location with respect to the impingement of the beam pulse, the computer causes the next beam pulse to be passed through the mask 170 so as to provide a second set of intensity patterns. During this second irradiation and due to the positioning of the sample 170 with respect to the impingement by the beam pulse impingement of the sample 170, the intensity pattern/beamlets that are shaped by the first and second slits 201, 211 of the first set of the slits of the first conceptual row 200 of the mask 150 impinge, irradiate, and fully melt throughout the entire thickness the corresponding portions 611, 616 of the respective first conceptual row 250 of the sample 170. At the same time, the first and second slits 301, 311 of the second set of the slits of the second conceptual row 300 of the mask 150 impinge, irradiate, and fully melt throughout the entire thickness the corresponding portions 711, 716 of the respective second conceptual row 350 of the sample 170. Also, the first and second slits 401, 411 of the second set of the slits of the third conceptual row 400 of the mask 150 impinge, irradiate, and fully melt throughout the entire thickness the corresponding portions 811, 816 of the respective third conceptual row 450 of the sample 170.

As shown in FIG. 4, the portions 616, 716, 816 partially overlap and are provided slightly below the respective re-solidified portions 602, 702, 802. In particular, these portions 616, 716, 816 re-melt certain areas of the respective portions 602, 702, 802. In particular, the top edge of the respective melted portions 616, 716, 816 are provided slightly above middle longitudinal extensions of the respective re-solidified portions 602, 702, 802 that correspond to middle extensions 202, 30, 402 of the respective first slits 201, 301, 401. In addition, the irradiated melted portions 611, 711, 811 extend along substantially the same longitudinal direction (i.e., along the X-direction) as that of the re-solidified portions 602, 702, 802, and are provided at an offset in the X-direction from these re-solidified portions 602, 702, 802. For example, the left edge of each of the portions 611, 711, 811 can either abut or overlap the right edge of each of the corresponding portions 602, 702, 802.

Then, the melted portions 611, 711, 811 begin to resolidify, and the grain growth thereof occurs substantially the same as that of the portions 601, 701, 801. The melted portions 616, 716, 816 also begin to resolidify. The grain growth from the bottom edges thereof occurs in a substantially the same manner as that of the portions 611, 711, 811. However, because the top edge of each of the portions 616, 716, 816 overlaps the middle longitudinal extensions of the re-solidified portions 602, 702, 802, respectively, the grains prevalent above these middle extensions in the re-solidified portions 602, 702, 802 seed the melted and resolidifying portions 616, 716, 816 from the top edges thereof and grow toward the center of each of the respective portions 616, 716, 816. In this manner, the grains grown in the re-solidified portions 602, 702, 802 extend into the resolidifying portions 616, 716 and 816, respectively.

Figure 5A:
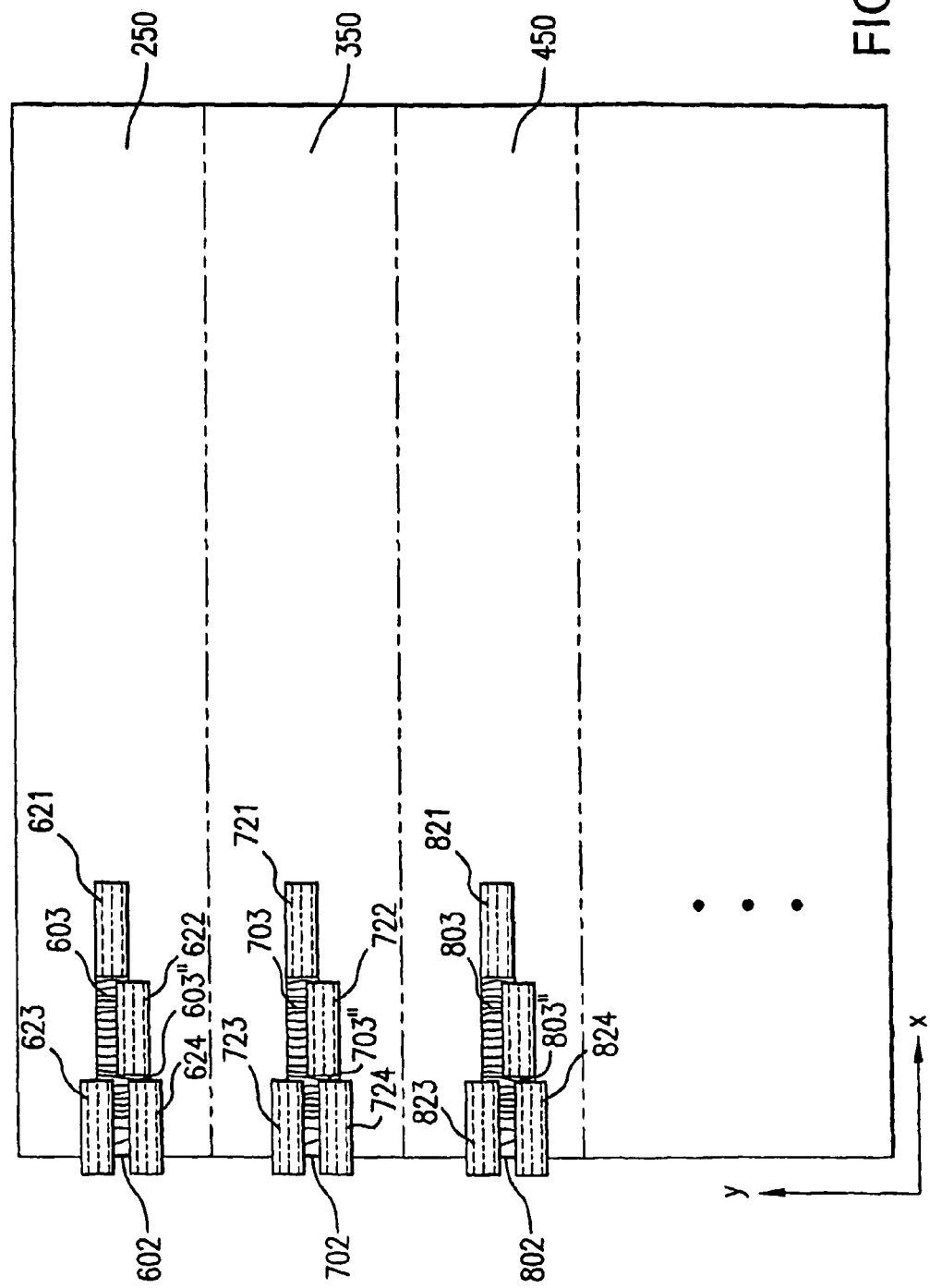
FIG. 5A shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.

As shown in FIG. 5A, the previously-irradiated portions 611, 711, 811 are re-solidified and crystallized into corresponding processed polycrystalline regions 603, 703, 803. In addition, the solidification of the previously-irradiated portion 616, 716, 816 are re-solidified into new corresponding processed polycrystalline regions 602, 702, 802. Then, when the sample 170 reaches the next sequential location with respect to the impingement of the beam pulse, the computer 100 again causes the next beam pulse to be passed through the mask 170 so as to provide a third set of intensity patterns. During this next irradiation and due to the positioning of the sample 170 with respect to the impingement by the beam pulse impingement of the sample 170, the intensity pattern/beamlets that are shaped by the first, second, third and fourth slits 201, 211, 221, 226 of the first set of the slits of the first conceptual row 200 of the mask 150 impinge, irradiate, and fully melt throughout the entire thickness the corresponding portions 621, 622, 623, 624 of the respective first conceptual row 250 of the sample 170. At the same time, the first, second, third and fourth slits 301, 311, 321, 326 of the second set of the slits of the second conceptual row 300 of the mask 150 impinge, irradiate, and fully melt throughout the entire thickness the corresponding portions 721, 722, 723, 724 of the respective second conceptual row 350 of the sample 170. Similar applies to the respective third conceptual row 450 of the sample 170.

FIG. 5A shows that the positioning of the respective first and second portions 621, 622, 721, 722, 821, 822 with respect to the re-solidified portion 603, 703, 803 is substantially the same as that of the respective first and second portions 611, 616, 711, 716, 821, 822 with respect to the re-solidified portion 603, 703, and 803, and thus shall not be described in further detail herein. Each pair of the third and fourth portions 623, 624, 723, 724, etc. are spaced apart from one another in substantially the same manner (or directly proportional to) the spacing between the respective slits 221, 226, 321, 326, etc. The melted third portions 623, 723, 823 partially overlap and are provided slightly above thee respective re-solidified portions 602, 702, 802. In addition, the melted fourth portions 624, 724, 824 partially overlap and are provided slightly below the respective re-solidified portions 602, 702, 802. Thus, these portions 623, 624, 723, 724, 823, 824 re-melt certain areas of the respective portions 602, 702, 802.

In particular, the bottom edges of the third melted portions 623, 723, 823 are provided slightly below the top edge of the respective re-solidified portions 602, 702, 802. Also, the top edge of the respective melted fourth portions 624, 724, 824 are provided slightly above middle longitudinal extensions of the respective previously re-solidified portions 602, 702, 802 that correspond to middle extensions 202, 302, 402 of the respective second slits 211, 311, etc. In addition, the left edges of each of the portions 623, 624, 723, 724, 823, 824 can either abut or overlap the right edge of each of the corresponding re-solidified portions 602, 702, 802.

Then, the melted portions 621-622, 721-722, 821-822 begin to resolidify, and the grain growth thereof occurs in substantially the same manner as that of the portions 611, 616, 711, 716, 811, 816. In addition, the seeds in the previously solidified portion 602 seeds the grains to grow into the third portion 623 and fourth portion 624. In particular, the grains of the portion 602 grow into the third portion 623 from the bottom edge thereof, and into the fourth portion 624 from the top edge thereof. The melted portions 616, 716, 816 also begin to resolidify. Indeed, because the top edge of each of the portions 624, 724, 824 overlaps the middle longitudinal extensions of the previously re-solidified portions 602, 702, 802, respectively, the grains prevalent above these middle extensions in the re-solidified portions 602, 702, 802 seed the melted and resolidifying fourth portions 624, 724, 824 from the top edges thereof and grow toward the center of each of the respective portions 624, 724, 824. Thus, the grains from the bottom edge of the fourth portions 624, 724, 824 and those from the top edges thereof (i.e., from the previously-solidified portions 602, 702, 802, respectively) grow toward the center of each of the respective fourth portions 624, 724, 824. In addition, the grains from the top edge of the third portions 623, 723, 823 and those from the bottom edges thereof (i.e., from the previously-solidified portions 602, 702, 802, respectively) also grow toward the center of each of the respective third portions 623, 723, 823. In this manner, the grains grown in the re-solidified portions 602, 702, 802 extend into the resolidifying portions 616, 716 and 816, respectively.

Figure 5B:
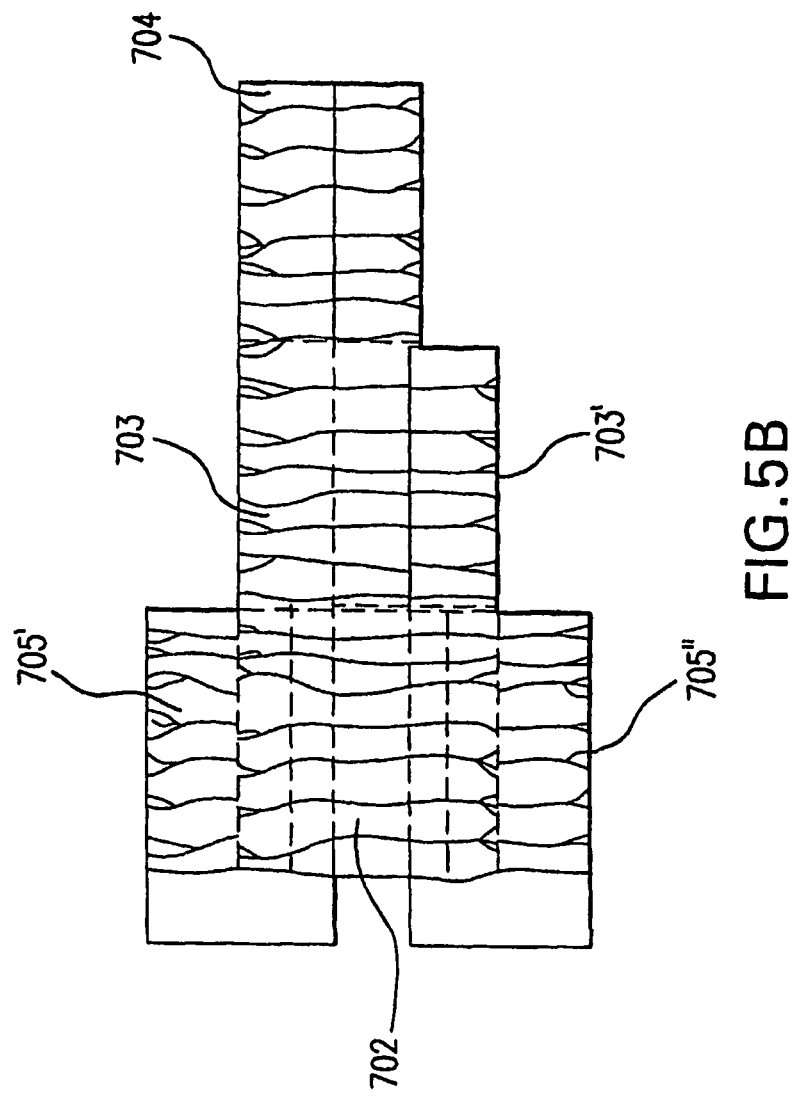
FIG. 5B shows an enlarged view of a re-solidified section of the sample shown in FIG. 5A that has been irradiated by the masked intensity pattern of the beam.

The enlarged view of a section of the portions of the second conceptual row 350 of the sample 170 that re-solidified from the melted portions 721-724 is illustrated in FIG. 5B. In particular, the portion 704 re-solidified from the first melted portion 721. The previously-re-solidified portion 703 seed the second melted portion 722 such that the grains of the portion 703 grow downward (in the negative Y-direction), while the grains from the bottom edge of the solidifying second portion 722 grow upward to meet the grains growing downward from the solidified portion 703, thereby forming a boundary there between, and form the newly solidified section 703 and another solidified section 703'. Additionally, the previously-re-solidified portion 702 seed both of the third and fourth melted portions 723, 724. In particular, the grains of the previously re-solidified portion 702 grow upward (in the Y-direction) into the resolidifying third portion 723, while the grains from the top edge of the solidifying third portion 723 grow downward to meet the grains growing upward from the solidified portion 702, so as to form a boundary there between. Also, the grains of the portion 702 grow downward (in the negative Y-direction) into the resolidifying fourth portion 724, while the grains from the bottom edge of the solidifying fourth portion 724 grow upward to meet the grains growing downward from the solidified portion 702, so as to form a boundary there between. In this manner, the grains of the new solidified portions 702 are extended bi-directionally to reach the middle sections of the third and fourth re-solidified portions 723, 724. The other half sections of the third and fourth sections 723, 724 have different grains therein, thus forming re-solidified portions 705', 705", respectively.

Figure 6A:
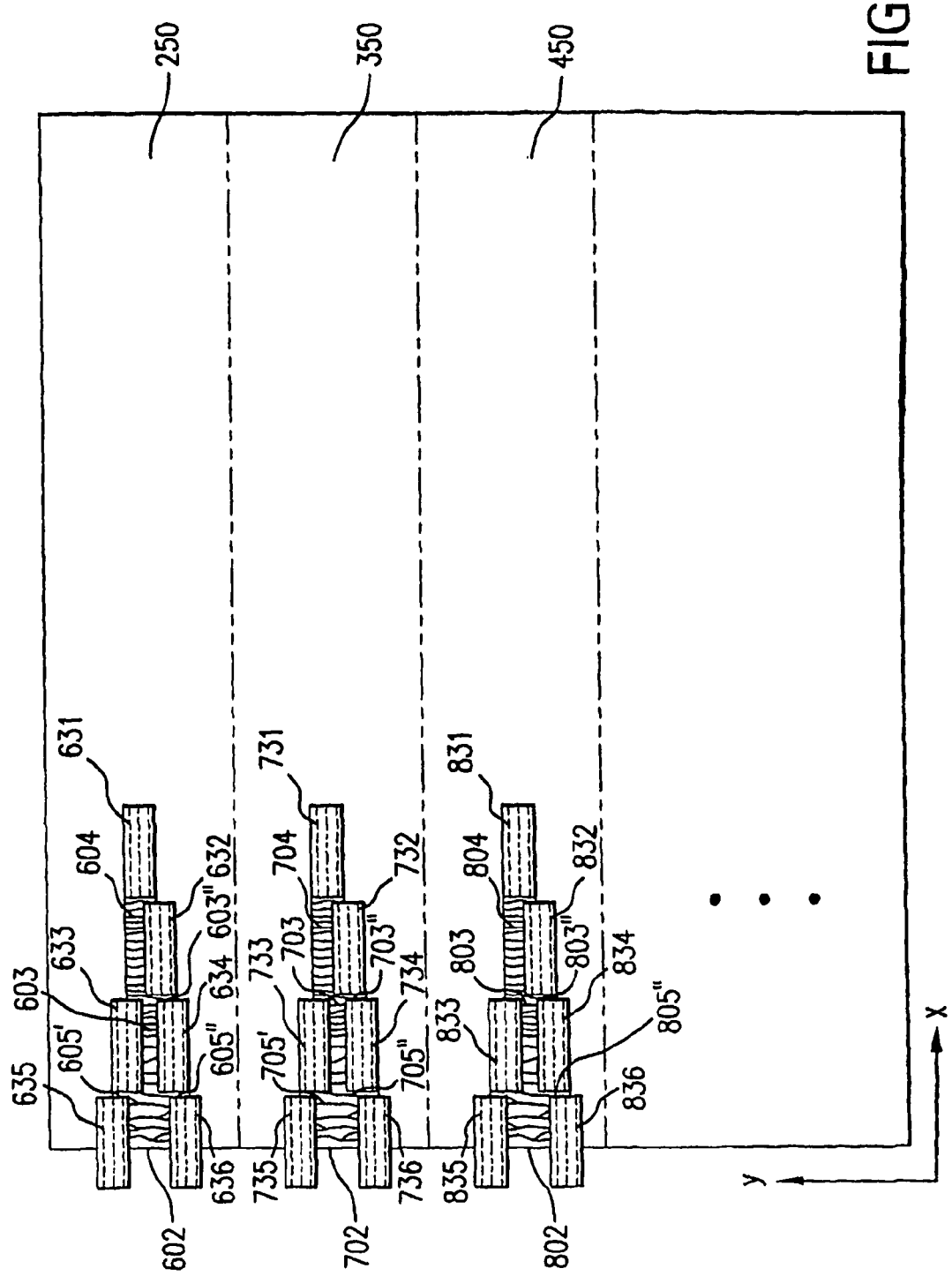
FIG. 6A shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.

Then, as shown in FIG. 6A, when the sample 170 reaches the next sequential location with respect to the impingement of the beam pulse, the computer 100 further causes the next beam pulse to be passed through the mask 170 so as to provide a fourth set of intensity patterns. During this next irradiation and due to the positioning of the sample 170 with respect to the impingement by the beam pulse impingement of the sample 170, the intensity pattern/beamlets that are shaped by the first, second, third, fourth, fifth and sixth slits 201, 211, 221, 226, 231, 236 of the first set of the slits of the first conceptual row 200 of the mask 150 impinge, irradiate, and fully melt throughout the entire thickness the corresponding portions 631-626 of the respective first conceptual row 250 of the sample 170. At the same time, the first, second, third, fourth, fifth and sixth slits 301, 311, 321, 326, 331, 336 of the second set of the slits of the second conceptual row 300 of the mask 150 impinge, irradiate, and fully melt throughout the entire thickness the corresponding portions 731-736 of the respective second conceptual row 350 of the sample 170. Similar applies to the respective third conceptual row 450 of the sample 170.

FIG. 6A shows that the positioning of the respective first and second portions 631-634, 731-734, 831-834 with respect to the re-solidified portion 603, 703, 803 is substantially the same as that of the respective first and second portions 621-624, 721-724, 821-824 with respect to the re-solidified portion 603, 603', 604, 703, 703', 704, 803, 803', 803, and thus shall not be described in further detail herein. Each pair of the fifth and sixth portions 635, 636, 735, 736, etc. are spaced apart from one another in a substantially the same manner (or directly proportional to) the spacing between the respective slits 231, 226, 331, 326, etc. The melted third portions 633, 733, 833 partially overlap and are provided slightly above thee respective re-solidified portions 603, 703, 803. The melted fourth portions 634, 734, 834 partially overlap and are provided slightly below the respective re-solidified portions 603, 703, 803. In addition, these melted fourth portions 634, 734, 834 completely cover the re-solidified portions 703'. The melted fifth portions 635, 735, 835 partially overlap and are provided slightly above thee respective re-solidified portions 602, 702, 802. In addition, the melted fifth portions 635, 735, 835 completely cover the re-solidified portions 705'. In addition, the melted sixth portions 636, 736, 836 partially overlap and are provided slightly below the respective re-solidified portions 602, 702, 802. Thus, these portions 623, 624, 723, 724, 823, 824 re-melt certain areas of the respective portions 602, 702, 802. The melted sixth portions 636, 736, 836 completely cover the re-solidified portions 705".

In particular, the bottom edges of the fifth melted portions 635, 735, 835 are provided slightly below the respective boundaries between the re-solidified portions 605-605', 705-705', 805-805'. The top edges of the sixth melted portions 636, 736, 836 are provided slightly above the respective boundaries between the re-solidified portions 605-605", 705-705", 805-805".

Figure 6B:
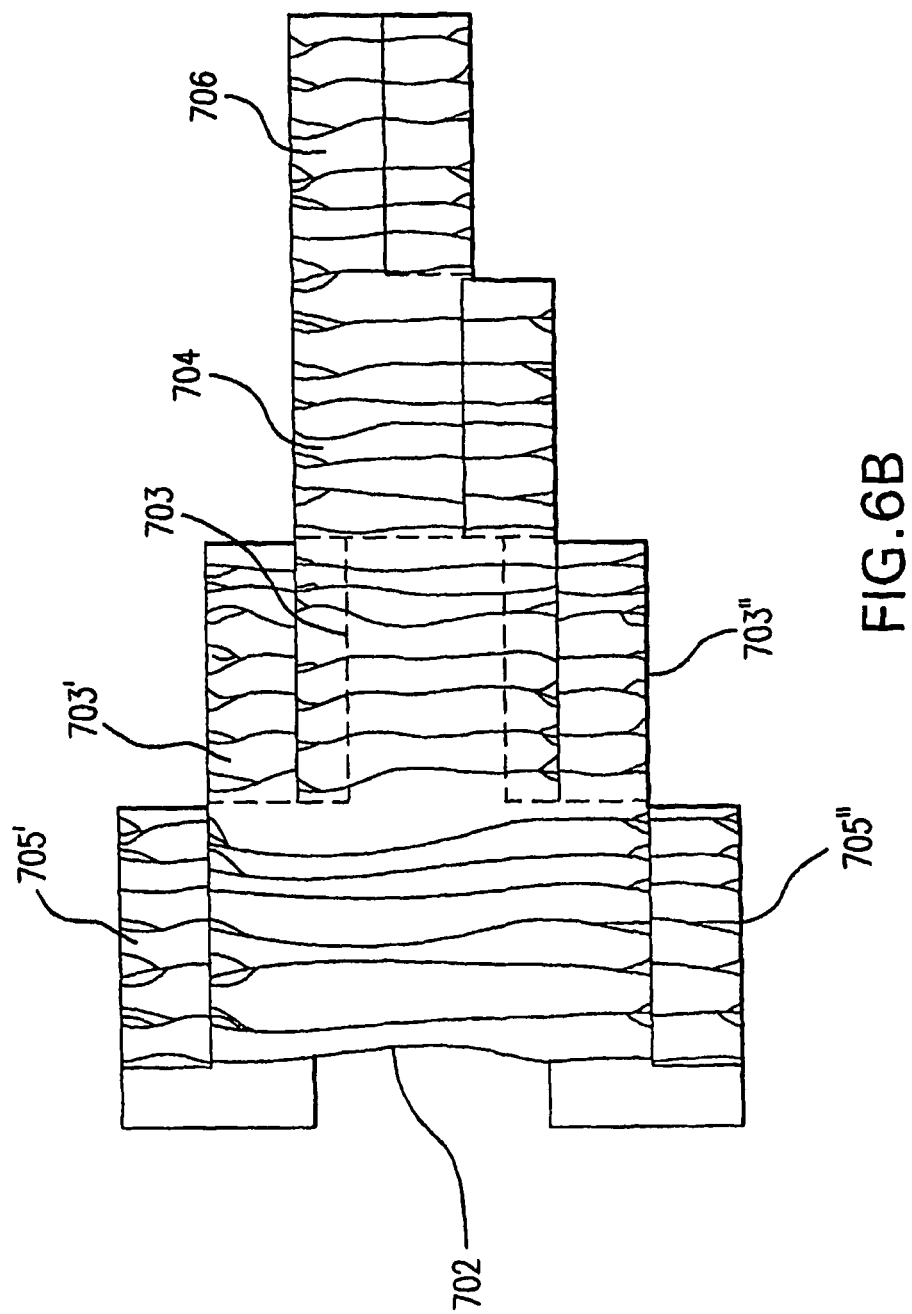
FIG. 6B shows an enlarged view of the re-solidified section of the sample shown in FIG. 6A that has been irradiated by the masked intensity pattern of the beam.
Figure 7:
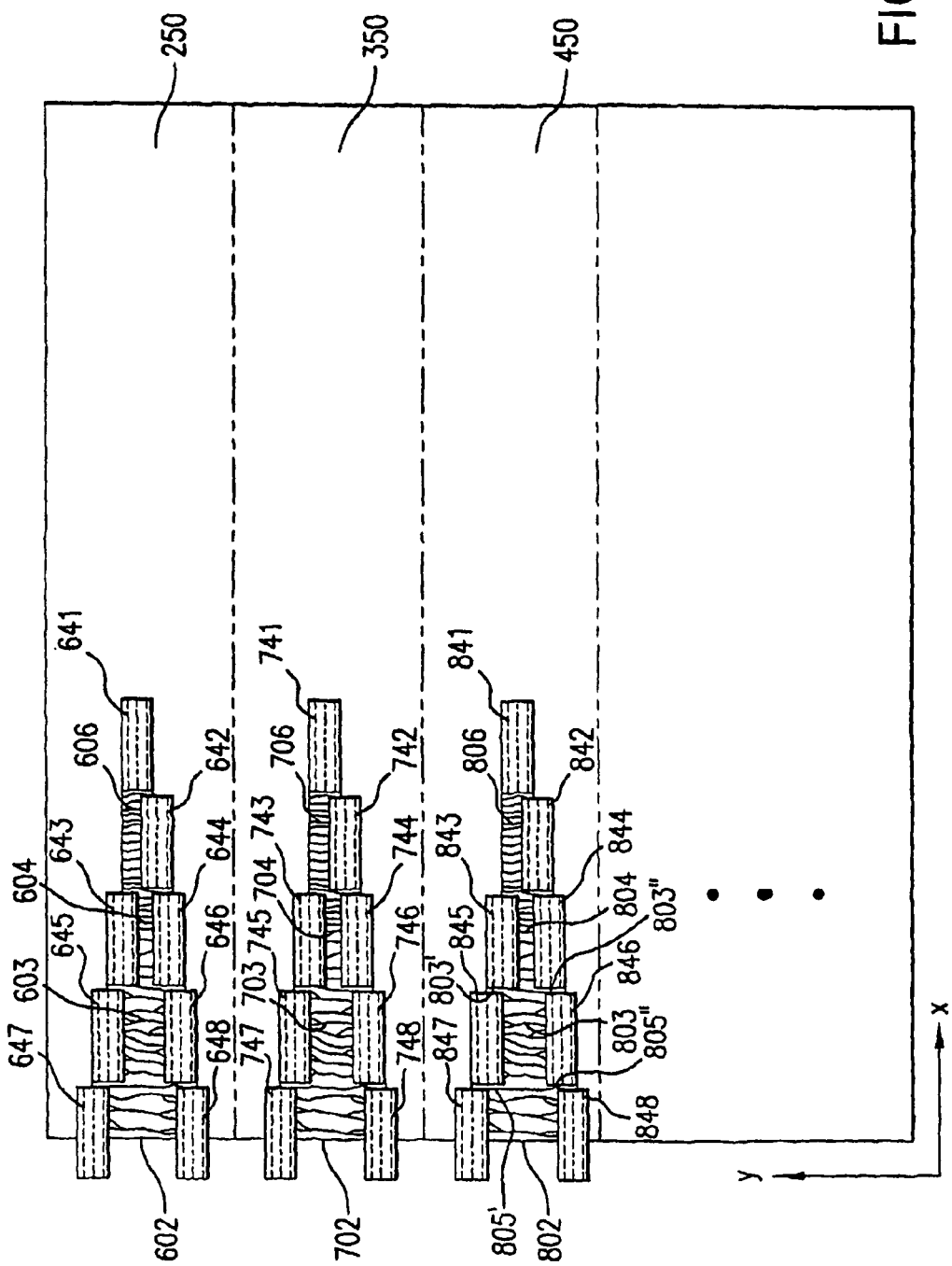
FIG. 7 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.
Figure 8:
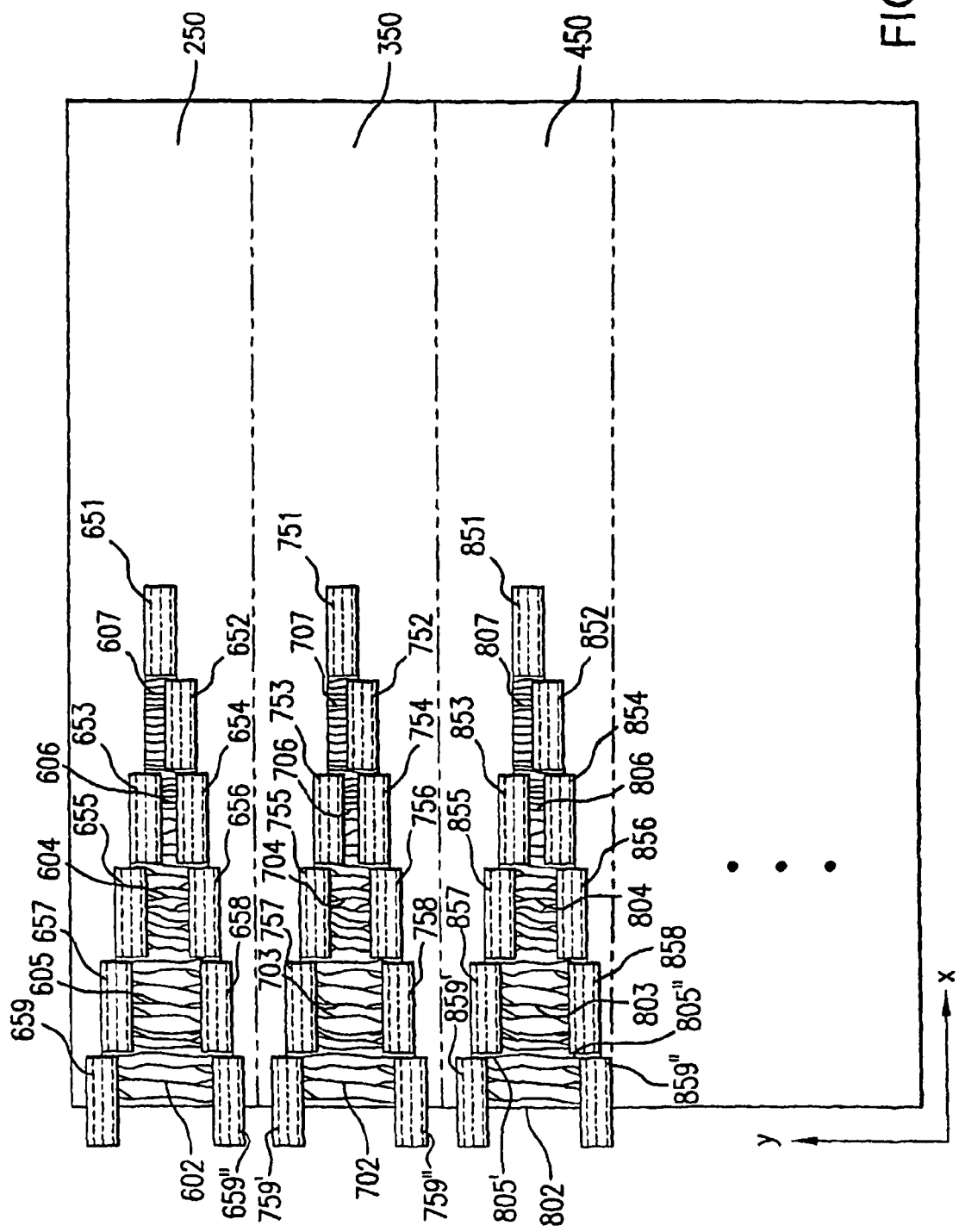
FIG. 8 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.
Figure 9:
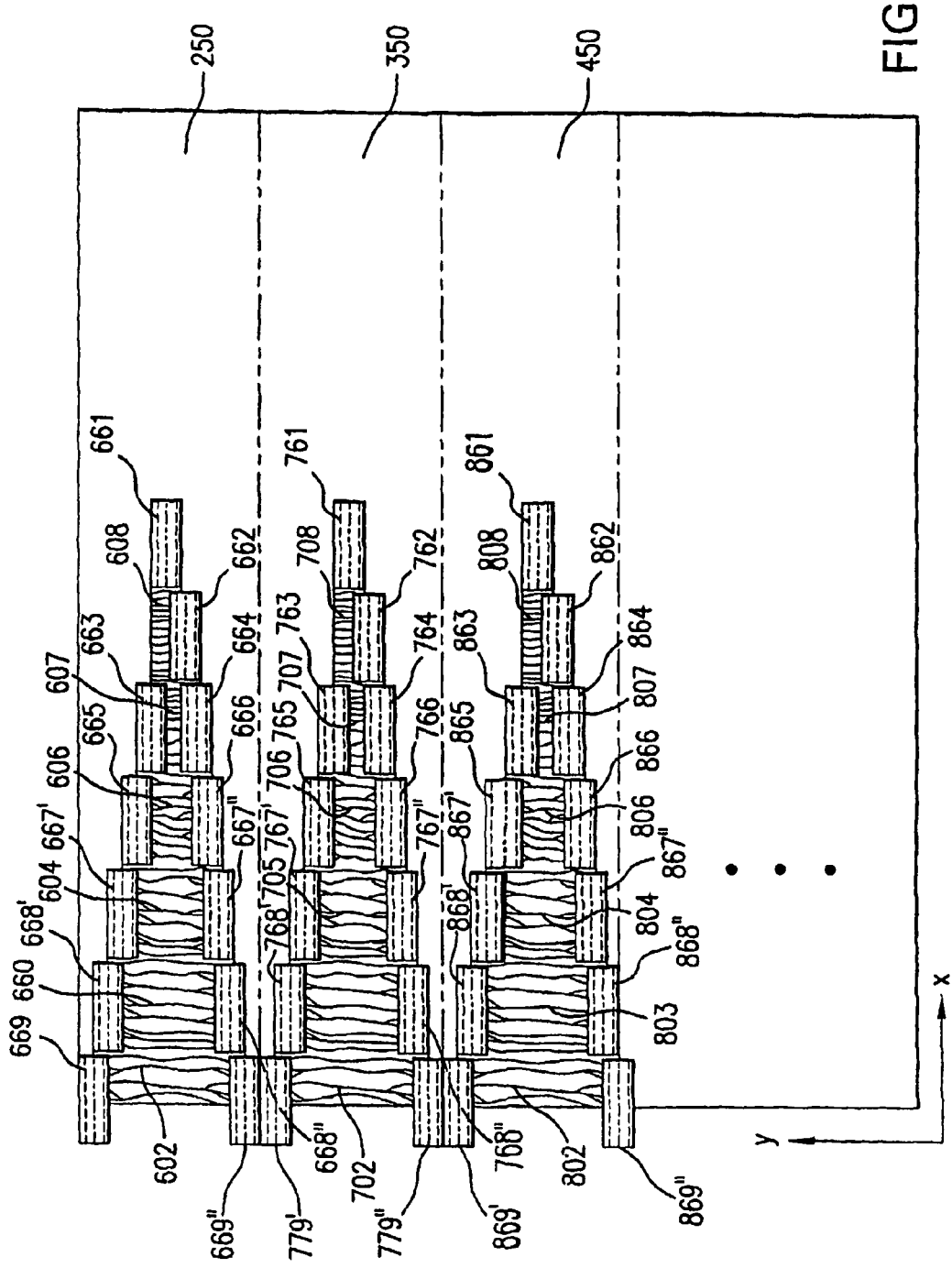
FIG. 9 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.
Figure 10:
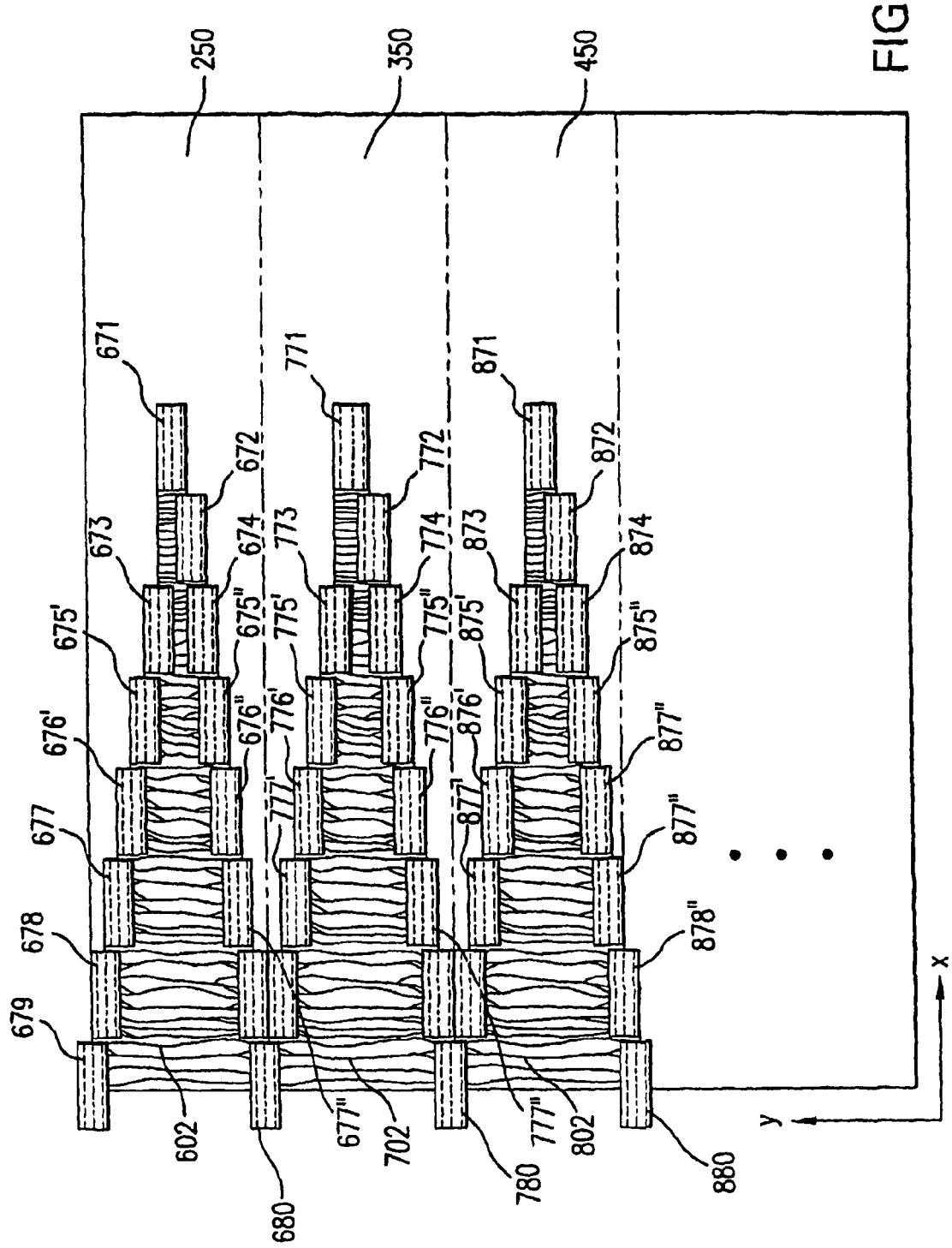
FIG. 10 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.
Figure 11:
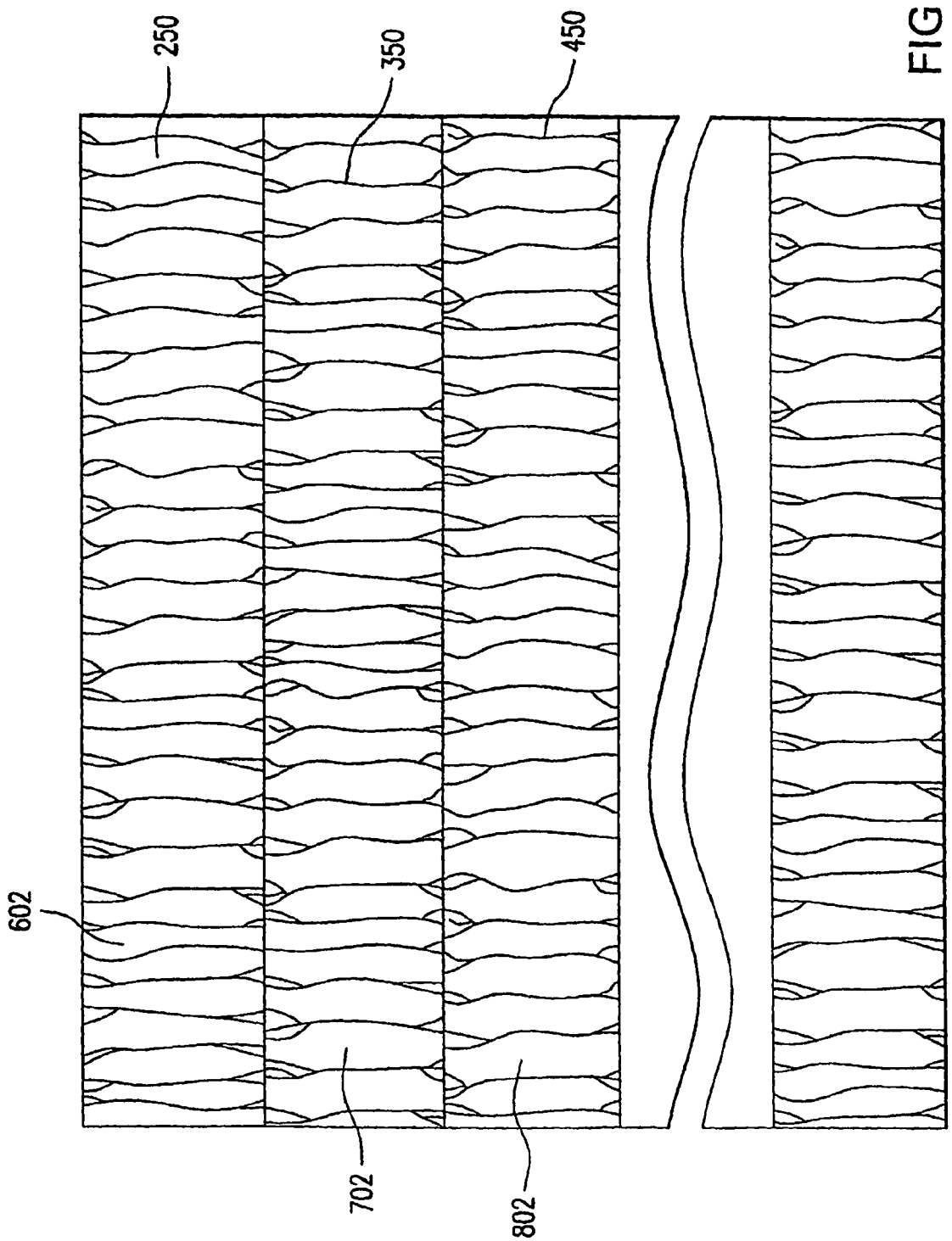
FIG. 11 shows sequential SLS stages that use the irradiation of the intensity pattern shaped by the pattern of the mask of FIG. 2, and the grain structures on an exemplary sample having the silicon thin film thereon according to the first exemplary embodiment of the method of the present invention.

The enlarged view of a section of the portions of the second conceptual row 350 of the sample 170 that re-solidified from the melted portions 731-736 is illustrated in FIG. 6B. In particular, the portion 706 re-solidified from the first melted portion 731. The previously-re-solidified portion 704 seed the second melted portion 732 such that the grains of the portion 704 grow downward (in the negative Y-direction), while the grains from the bottom edge of the solidifying second portion 732 grow upward to meet the grains growing downward from the solidified portion 703, thereby forming a boundary there between, and form the newly solidified section 703 and another solidified section 703'. The previously-re-solidified portion 703 seeds both of the third and fourth melted portions 733, 734, and other portions 703', 703" are formed as discussed above with reference to portions 705', 705". In addition, the grains of the previously re-solidified portion 702 grow further upward (in the Y-direction) into the resolidifying fifth portion 735, while the grains from the top edge of the solidifying fifth portion 735 grow downward to meet the grains growing upward from the solidified portion 702, so as to form a boundary there between. Also, the grains of the portion 702 grow downward (in the negative Y-direction) into the resolidifying sixth portion 736, while the grains from the bottom edge of the solidifying sixth portion 736 grow upward to meet the grains growing downward from the solidified portion 702, so as to form a boundary there between. In this manner, the grains of the new solidified portions 702 are again further extended bi-directionally to reach the middle sections of the fifth and sixth re-solidified portions 735, 736. The other half sections of the fifth and sixth portions 735, 736 have different grains therein, thus forming new re-solidified portions 705', 705", respectively. Thus, the larger grain (i.e., grain length along the axis parallel to the lateral growth) for any number of shots This exemplary procedure according to the present invention continues as shown in FIGS. 7-10, as the pattern of the slits of the mask 150 are utilized to shape the beam pulses irradiating predetermined portions of the sample 170, as the computer continuously translates the sample with the aid of the translation stage 180. In particular, the computer continuously translates the sample to provide further melt regions 641-648, 741-748, and 841-848, as shown in FIG. 7, melt regions 651-659, 751-759 and 851-859, as shown in FIG. 8, melt regions 661-669, 761-769 and 861-869, as shown in FIG. 9 and melt regions 671-680, 771-780 and 871-880, as shown in FIG. 10, which are re-solidified to form new solidified portions extending bi-directionally. In this manner, the grains in the portions 602, 702, 802 are continuously grown in opposite directions (i.e., bi-directionally) using n-number of shots, continuous motion SLS technique described herein above, thereby increasing the length thereof via a relatively small number of pulses. The conceptual rows 250, 350, 450 of the sample processed according to the exemplary embodiment of the present invention described herein above are shown in FIG. 11, with respective portions 602, 702, 802 having long polycrystalline grains provided therein. For example, the length of the grains can be provided as follows:

$$L_G \approx 2(N_S) \times D_{MS},$$

Where $L_G$ is the length of the particular grain, $N_S$ is the number of shots affecting such particular grain, and $D_{MS}$ is the distance from one step to the next (i.e., microstep).

It should be understood that it is possible to obtain such longer grain growth using the exemplary procedure according to the present not only for the entire sample 170, but also for selective portions thereof. Indeed, the computer 100 can be programmed such that it controls the translations stage 180 to translate the sample 170 in a predetermined manner such that only the pre-selected sections of the sample 170 are irradiated. In fact, it is possible to process not only conceptual rows of the sample, but also column, regular shaped sections and irregular-shaped section. Thus, it is possible for the computer to also control the triggering of the beam pulse to be performed when the sample 170 is translated to a predetermined position for irradiation. In addition, it is possible to utilize dot-shaped patterns in the mask 150 so as to generate such-shaped intensity patterns to irradiate the selected sections of the sample 170. These patterns in the mask 170, as well as other possible patterns that can be used for obtaining bi-directional grain growth according to the continuous motion SLS procedure described above are shown and described in U.S. Pat. No. 6,555,449, the entire disclosure of which is incorporated herein by reference.

Figure 12A:
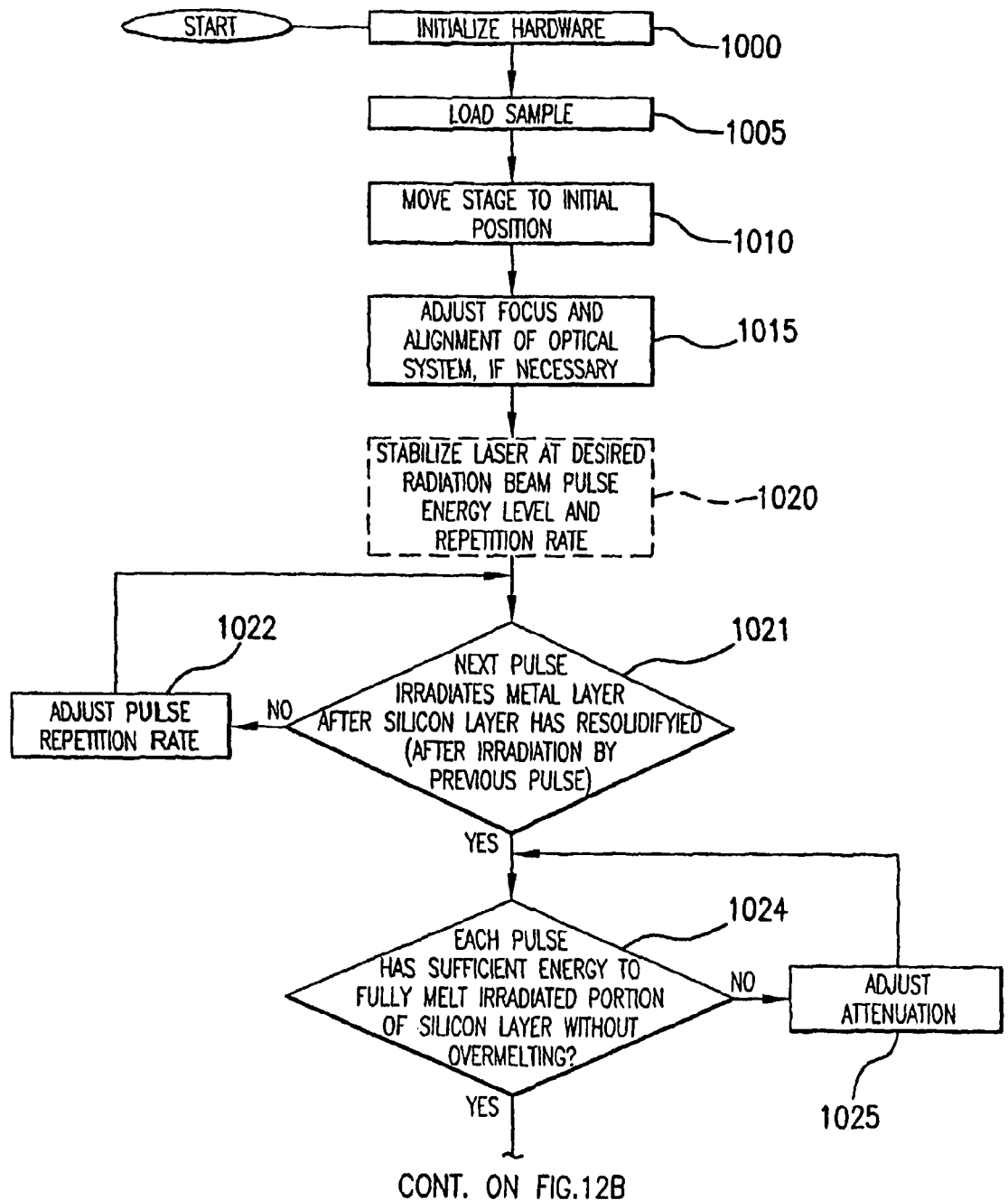
FIG. 12 shows a flow diagram illustrating the steps implemented by the system of FIG. 1 and the procedure illustrated in FIGS. 3-11 according to an exemplary embodiment of the present invention.
Figure 12B:
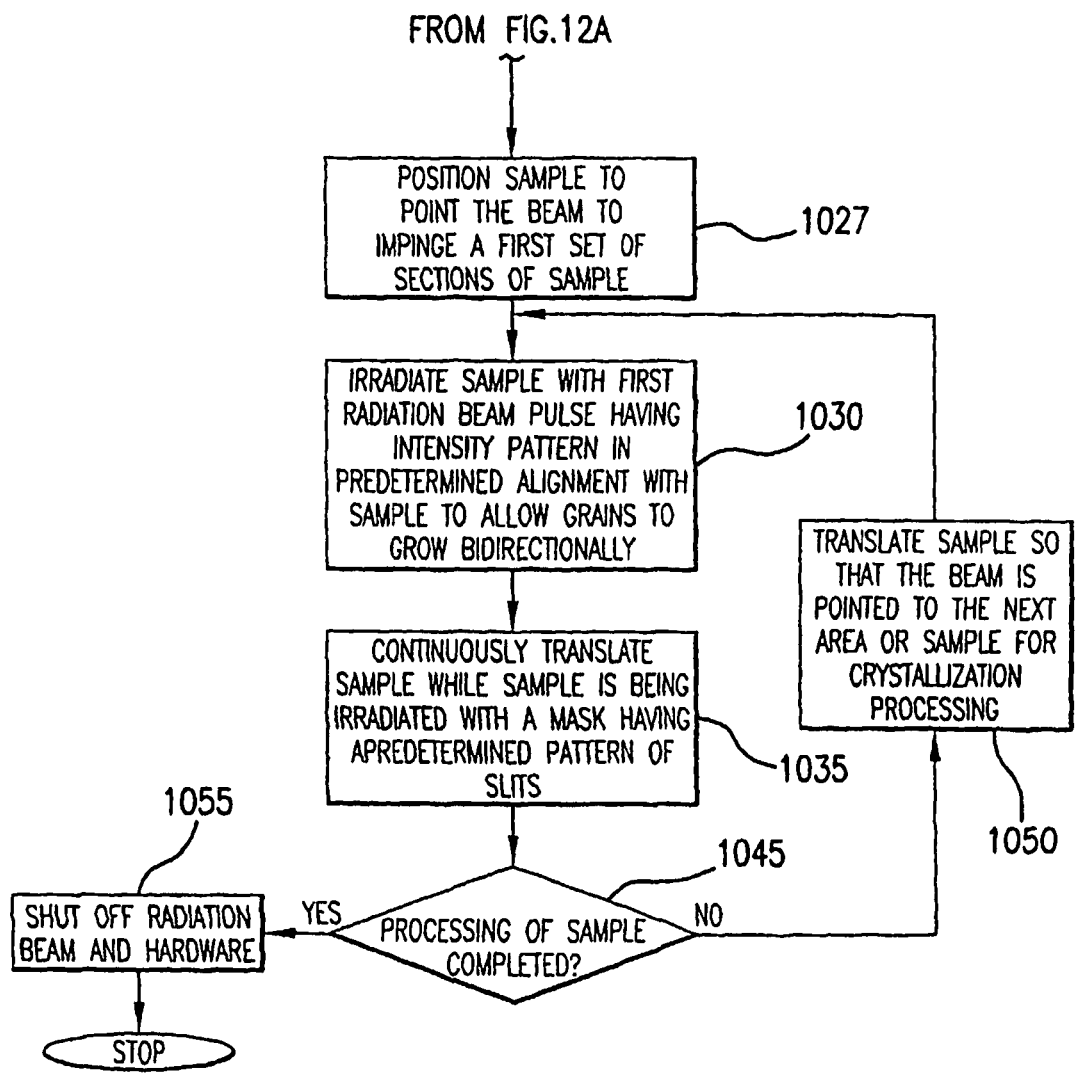

Referring next to FIG. 12, there is shown a flow diagram of exemplary steps carried out with the aid of the computer 100 (or other control devices) for the single-step, continuous motion SLS processing in accordance with the present invention to control the length of grains, and the location and orientation of grain boundaries in the thin film of the sample 170. As shown in the flow diagram of FIG. 12, in step 1000 the hardware components of the system of FIG. 1, such as the excimer laser 110, the beam energy density modulator 120, the beam attenuator 130 and the shutter 152 are first initialized at least in part by the computer 100. A sample 170 is loaded onto the sample translation stage 180 in step 1005. It should be noted that such loading may be performed either manually or automatically using known sample loading apparatus under the control of the computer 100. Next, the sample translation stage 180 is moved, preferably under the control of the computer 100, to an initial position in step 1010. The various other optical components of the system are adjusted manually or under the control of the computer 100 for a proper focus and alignment in step 1015, if necessary. The radiation beam pulses 164 are then stabilized in step 1020 to a desired intensity, pulse duration and pulse repetition rate. In step 1021, it is determined whether a next radiation beam pulse irradiates the silicon thin film 170 after each melted region thereof has completely re-solidified following the irradiation by a previous radiation beam pulse. If not, in step 1022, the pulse repetition rate of the excimer laser 110 is adjusted. In step 1024 it is determined whether each beamlet of the intensity pattern of each radiation beam pulse has sufficient intensity to melt each one of the thin film irradiated thereby throughout its entire thickness without melting an adjacent region overlapped by a shadow region of the intensity pattern. If under-melting or over melting occurs, in step 1025, the attenuator 130 is adjusted so that each radiation beam pulse has sufficient energy to fully melt the metal layer in irradiated areas without over melting adjoining unirradiated regions.

In step 1027, the sample 170 is positioned to point the masked irradiated beam pulse 164 at the conceptual rows 250, 350, 450 of the sample 170. In step 1030, the sample 170 is irradiated using the radiation beam pulse 164 having an intensity pattern controlled by the mask 150. In this manner, the grains in each of the conceptual rows 250, 350, 450 are grown in a bi-directional manner. In step 1035, the sample 170 is continuously translated so that the masked irradiated beam pulse 164 continuously irradiates the thin film of the sample 170 in a predetermined direction, and pursuant to the exemplary procedure described above with reference FIGS. 3-11.

In step 1045, it is determined whether the sample 170 (or desired portions thereof) has been subjected to the above-described SLS processing. If not, the sample 170 is translated such that the unirradiated desired area or the sample 170 can be irradiated and processed according to the present invention, and the process loops back to step 1030 for further processing. If such SLS processing has been completed for the sample 170 or desired sections thereof, the hardware components and the beam of the system shown in FIG. 1 can be shut off (step 1055), and the process may terminate.

The foregoing exemplary embodiments merely illustrate the principles of the present invention. Various modifications and alterations to the described embodiments will be apparent to those skilled in the art in view of the teachings herein without departing from the scope of the invention, as defined by the appended claims.

The invention claimed is:

1. A method for processing at least one portion of a thin film sample on a substrate, the at least one portion of the film sample having a first boundary and a second boundary, the method comprising the steps of:
    (a) controlling an irradiation beam generator to emit successive irradiation beam pulses at a predetermined repetition rate;
    (b) masking each of the irradiation beam pulses to define one or more first beamlets and one or more second beamlets;
    (c) continuously scanning, at a constant predetermined speed, the film sample;
    (d) during step (c), successively irradiating one or more first areas of the film sample by the first beamlets so that the first areas are melted throughout their thickness, wherein each one of the first areas irradiated by the first beamlets of each of the irradiation beam pulses is allowed to re-solidify and crystallize thereby having grains grown longitudinally therein forming a grain boundary; and
    (e) during step (c) and after step (d), successively irradiating two or more second areas of the film sample by the second beamlets of the irradiation beam pulses so that the second areas are melted throughout their thickness, wherein at least two of the second areas partially overlap a particular area of the re-solidified and crystallized first areas, and
    wherein at least a first one of the at least two of the second areas overlaps the grain boundary substantially along a length of the grain boundary provided within the particular area and at least a second one of the at least two of the second areas overlaps a parallel grain boundary parallel to the grain boundary substantially along a length of the parallel grain boundary provided within the particular area, and wherein the particular area extends along a first axis and the grains therein are longitudinally oriented, the first one of the at least two of the second areas extends along a second axis that is parallel to the first axis, is arranged at a first location that is offset from the first axis, and has a side parallel to the first axis and overlapping an unirradiated region of the film sample, and the second one of the at least two of the second areas extends along a third axis that is parallel to the first axis, is arranged at a second location that is offset from the first axis and provided opposite from the first location, and has side parallel to the first axis and overlapping an unirradiated region of the film sample, and wherein the grains provided in the particular area grow in a longitudinal direction into each of the at least two of the second areas upon a re-solidification thereof such that the grains grown longitudinally extend between the third axis towards the second axis.

2. The method according to claim 1, wherein the particular area of the re-solidified and crystallized first areas includes a first set of grains and a second set of grains, and wherein a grain boundary provided within the particular area separates the first set of grains from the second set of grains.

3. The method according to claim 1, wherein the at least one of the second areas partially overlap approximately half of the particular area of the re-solidified and crystallized first areas.

4. The method according to claim 1, wherein another one of the two of the at least two of the second areas does not overlap any grain boundary provided within the particular area.

5. The method according to claim 1, wherein another one of the at least two of the second areas covers a further grain boundary provided within the particular area.

6. The method according to claim 1, further comprising the steps of:
(f) masking each of the irradiation beam pulses to define one or more third beamlets and one or more fourth beamlets; and
(g) during step (c) and after step (e), successively irradiating third and fourth areas of the film sample by the third and fourth beamlets, respectively, to completely melt the respective third and fourth areas throughout their thickness, wherein at least one of the third areas partially overlaps a first one of the at least two of the re-solidified and crystallized second areas such that the grains provided in a second particular area grow into the at least one of the third areas upon a re-solidification thereof to form a second grain boundary, and wherein at least one of the fourth areas partially overlaps a second one of the at least two of the re-solidified and crystallized second areas such that the grains provided in the particular area grow into the at least one of the fourth areas upon a re-solidification thereof forming a third grain boundary.

7. The method according to claim 6, wherein at least one of the third areas overlaps the second grain boundary, and wherein the at least one of the third areas overlaps the third grain boundary.

8. A system for processing at least one portion of a thin film sample on a substrate, the at least one portion of the film sample having a first boundary and a second boundary, the system comprising: a mask provided in cooperation with an irradiation beam generator; a processing arrangement which is programmable to perform the following steps:
(a) control the irradiation beam generator to emit successive irradiation beam pulses at a predetermined repetition rate such that each of the irradiation beam pulses are passed through the mask so as to define one or more first beamlets and one or more second beamlets;
(b) control at least one of the irradiation beam generator and a translation arrangement to continuously scan at a constant predetermined speed the film sample;
(c) during step (b), control at least one of the translation arrangement and the beam pulses to successively irradiate one or more first areas of the film sample by the first beamlets so that the first areas are melted throughout their thickness, wherein each one of the first areas irradiated by the first beamlets of each of the irradiation beam pulses is allowed to re-solidify and crystallize thereby having grains grown therein forming a grain boundary; and
(d) during step (b) and after step (c), control at least one of the translation arrangement and the beam pulses to successively irradiate two or more second areas of the film sample by the second beamlets of the irradiation beam pulses so that the second areas are melted throughout their thickness, wherein at least two of the second areas partially overlap a particular area of the re-solidified and crystallized first areas, and wherein at least a first one of the at least two of the second areas overlaps the grain boundary substantially along a length of the grain boundary provided within the particular area and at least a second one of the at least two of the second areas overlaps a parallel grain bound parallel to the grain boundary substantially along a length of the parallel grain boundary provided within the particular area, and wherein the particular area extends along a first axis and the grains therein are longitudinally oriented, the first one of the at least two of the second areas extends along a second axis that is parallel to the first axis, is arranged at a first location that is offset from the first axis, and has a side parallel to the first axis and overlapping an unirradiated region of the film sample, and the second one of the at least two of the second areas extends along a third axis that is parallel to the first axis, wherein the first one of the at least two of the second areas is arranged at a first location that is offset from the first axis, is arranged at a second location that is offset from the first axis and provided opposite from the first location, and has side parallel to the first axis and overlapping an unirradiated region of the film sample, and wherein the grains provided in the particular area grow in a longitudinal direction into each of the at least two of the second areas upon a re-solidification thereof such that the grains grown longitudinally extend between the third axis towards the second axis.

9. The system according to claim 8, wherein the particular area of the re-solidified and crystallized first areas includes a first set of grains and a second set of grains, and wherein a grain boundary provided within the particular area separates the first set of grains from the second set of grains.

10. The system according to claim 8, wherein another one of the two of the at least two of the second areas does not overlap any grain boundary provided within the particular area.

11. The system according to claim 8, wherein the at least one of the second areas partially overlap approximately half of the particular area of the re-solidified and crystallized first areas.

12. The system according to claim 8, wherein another one of the at least two of the second areas covers a further grain boundary provided within the particular area.

13. The system according to claim 8, wherein each of the irradiation beam pulses is masked to define one or more third beamlets and one or more fourth beamlets, and wherein the processing arrangement is further programmable to perform the following steps:

(h) during step (b) and after step (d), control at least one of the translation arrangement and the beam pulses to successively irradiating third and fourth areas of the film sample by the third and fourth beamlets, respectively, to completely melt the respective third and fourth areas throughout their thickness, wherein at least one of the third areas partially overlaps a first one of the at least two of the re-solidified and crystallized second areas such that the grains provided in a second particular area grow into the at least one of the third areas upon a re-solidification thereof to form a second grain boundary, and wherein at least one of the fourth areas partially overlaps a second one of the at least two of the re-solidified and crystallized second areas such that the grains provided in the particular area grow into the at least one of the fourth areas upon a re-solidification thereof forming a third grain boundary.

14. The system according to claim 13, wherein at least one of the third areas overlaps the second grain boundary, and wherein the at least one of the third areas overlaps the third grain boundary.

* * * * *